(12) United States Patent
Wang et al.

(10) Patent No.: US 11,394,488 B2
(45) Date of Patent: Jul. 19, 2022

(54) POLARIZED CODING METHOD AND APPARATUS, ELECTRONIC DEVICE, AND STORAGE MEDIUM

(71) Applicant: CHINA ACADEMY OF TELECOMMUNICATIONS TECHNOLOGY, Beijing (CN)

(72) Inventors: Jiaqing Wang, Beijing (CN); Di Zhang, Beijing (CN); Fang-Chen Cheng, Beijing (CN); Shaohui Sun, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 156 days.

(21) Appl. No.: 16/652,431

(22) PCT Filed: Sep. 7, 2018

(86) PCT No.: PCT/CN2018/104629
§ 371 (c)(1),
(2) Date: Mar. 31, 2020

(87) PCT Pub. No.: WO2019/062521
PCT Pub. Date: Apr. 4, 2019

(65) Prior Publication Data
US 2020/0235847 A1    Jul. 23, 2020

(30) Foreign Application Priority Data

Oct. 1, 2017 (CN) .......................... 201710924773.2
Nov. 17, 2017 (CN) ........................... 201711149116.1

(51) Int. Cl.
*H04L 1/00* (2006.01)
*H03M 13/09* (2006.01)
*H03M 13/13* (2006.01)

(52) U.S. Cl.
CPC .......... *H04L 1/0013* (2013.01); *H03M 13/09* (2013.01); *H03M 13/13* (2013.01); *H04L 1/0061* (2013.01)

(58) Field of Classification Search
CPC ... H04L 1/0013; H04L 1/0061; H04L 1/0057; H04L 1/00; H04L 1/0015; H04L 1/0067; H03M 13/09; H03M 13/13; H03M 13/43
See application file for complete search history.

(56) References Cited

U.S. PATENT DOCUMENTS

2016/0218743 A1   7/2016  Li et al.
2018/0097580 A1*  4/2018  Zhang ................... H03M 13/13
(Continued)

FOREIGN PATENT DOCUMENTS

| CN | 106230555 A | 12/2016 |
|---|---|---|
| CN | 107204779 A | 9/2017 |
| WO | 2017128700 | 8/2017 |

OTHER PUBLICATIONS

ZTE et al.,"WF of Polar code segmentation for large UCI", 3GPP TSG RAN WG1 NR Ad-Hoc#3, Nagoya, Japan, Sep. 18-21, 2017, total 8 pages, R1-1716852.
(Continued)

*Primary Examiner* — Walter J Divito
(74) *Attorney, Agent, or Firm* — Kilpatrick Townsend & Stockton, LLP

(57) ABSTRACT

A polarized coding method and apparatus, an electronic device, and a storage medium are disclosed. The method comprises: determining fragmentation policies corresponding to sequences to be coded according to the lengths of the sequences to be coded and transmission rates; and performing corresponding processing on the sequences to be coded according to the segmentation policies, and performing polarized coding on the processed sequences to be coded. In embodiments of the present invention, fragmentation poli-
(Continued)

cies corresponding to sequences to be coded are determined according to the lengths of the sequences to be coded and transmission rates; and corresponding segmentation polices are determined according to the to-be-coded sequences having different lengths and different transmission rates, thereby ensuring performance of an uplink control channel.

9 Claims, 6 Drawing Sheets

(56) References Cited

U.S. PATENT DOCUMENTS

| | | | |
|---|---|---|---|
| 2020/0021392 A1* | 1/2020 | Xu | H03M 13/6362 |
| 2020/0099393 A1* | 3/2020 | Xu | H03M 13/2927 |
| 2020/0099399 A1* | 3/2020 | Xie | H04W 72/042 |

OTHER PUBLICATIONS

ZTE, "Segmentation of Polar codes", 3GPP TSG RAN WG1 NR Ad-Hoc#2, Qingdao, China, Jun. 27-30, 2017, total 6 pages, R1-1710849.

Intel Corporation, "Discussion on Polar code rate-matching", 3GPP TSG RAN WG1 Meeting NR-Adhoc#2, Qingdao, P. R. China, Jun. 27-30, 2017, total 3 pages, R1-1711349.

ZTE et al., "Segmentation of Polar code for large UCI", 3GPP TSG RAN WG1 Meeting #90bis, Prague, Czechia, Oct. 9-13, 2017, total 7 pages, R1-1718412.

Mediatek Inc. "Check on Polar Rate-Matching Function", 3GPP TSG RAN WG1 RAN1 Meeting Ad-Hoc #3, R1-1716678, Sep. 18-21, 2017.

ZTE et al. "Segmentation of Polar Code for Large UCI" 3GPP TSG RAN WG1 NR Ad-Hoc#3, R1-1715667, Nagoya, Japan, Sep. 18-21, 2017.

* cited by examiner

POLARIZED CODING METHOD AND APPARATUS, ELECTRONIC DEVICE, AND STORAGE MEDIUM

The present application is a U.S. National Stage of International Application No. PCT/CN2018/104629, filed on Sep. 7, 2018, which claims the priorities from Chinese Patent Application No. 201710924773.2 filed with the Chinese Patent Office on Oct. 1, 2017 and entitled "Polar Coding Method and Apparatus, Electronic Device, and Storage Medium" and Chinese Patent Application No. 201711149116.1 filed with the Chinese Patent Office on Nov. 17, 2017 and entitled "Polar Coding Method and Apparatus, Electronic Device, and Storage Medium", which are hereby incorporated by reference in their entirety.

FIELD

The invention relates to the field of communication technologies, and in particular, to a polar coding method and apparatus, an electronic device, and a storage medium.

BACKGROUND

Polar codes in the control channel coding scheme of the Enhanced Mobile Broadband (eMBB) scene of 5th-Generation (5G) mobile communication technology is a coding technology that may achieve the binary symmetrical channel capacity and have the excellent decoding performance. However, when the mother code length is larger, the polar code requires a larger storage capacity and latency, so in the 5G technology, the mother code length of the polar code is at most 512 bits in the downlink and at most 1024 bits in the uplink. However, due to the Massive Multiple-Input Multiple-Output (Massive MIMO) technology, the length of the information sequence of the Uplink Control Information (UCI) increases dramatically, and thus the length of the corresponding sequence to be encoded also increases dramatically during the polar coding of the UCI, where the sequence to be encoded is the Uplink Control Information payload (UCI payload) obtained by adding a Cyclic Redundancy Check (CRC) sequence behind the information sequence of the UCI.

In order to ensure the coverage rate during communication, the low-bit-rate transmission is sometimes required. However, during the low-bit-rate transmission, when the length of the corresponding sequence to be encoded is larger, the direct polar coding of the sequence to be encoded may significantly reduce the performance of the uplink control channel. In order to solve the problem that the larger sequence to be encoded affects the performance of the uplink control channel at a low bit rate, the larger sequence to be encoded is segmented in the prior art, i.e., divide the sequence to be encoded into two segments for the polar coding, to ensure the performance of the uplink control channel.

However, in the prior art, only one fixed segmentation strategy is adopted when performing the polar coding, that is, all the sequences to be encoded are segmented, or none of the sequences to be encoded is segmented, which may reduce the performance of the uplink control channel. Therefore, there is an urgent need for a polar coding scheme which can determine the segmentation strategy corresponding to the sequence to be encoded flexibly to ensure the performance of the uplink control channel.

SUMMARY

Embodiments of the invention provide a polar coding method and apparatus, an electronic device, and a storage medium, so as to provide a polar coding scheme for determining the segmentation strategy corresponding to the sequence to be encoded flexibly to ensure the performance of the uplink control channel.

An embodiment of the invention discloses a polar coding method, which includes:

determining a segmentation strategy corresponding to a sequence to be encoded according to a length of the sequence to be encoded and a transmission code rate;

processing the sequence to be encoded according to the segmentation strategy, and performing polar coding on the processed sequence to be encoded.

Further, the determining a segmentation strategy corresponding to a sequence to be encoded according to a length of the sequence to be encoded and a transmission code rate, includes:

judging whether the transmission code rate is greater than or greater than/equal to a preset first code rate threshold;

if it is determined that the transmission code rate is greater than or greater than/equal to the preset first code rate threshold, determining not to segment the sequence to be encoded.

Further, the determining a segmentation strategy corresponding to a sequence to be encoded according to a length of the sequence to be encoded and a transmission code rate, includes:

if the transmission code rate is not greater than or less than a preset first code rate threshold and not less than or greater than a preset second code rate threshold, judging whether the length of the sequence to be encoded is greater than or greater than/equal to a preset first length threshold, wherein the first code rate threshold is greater than the second code rate threshold;

if it is determined that the length of the sequence to be encoded is greater than or greater than/equal to the preset first length threshold, determining to segment the sequence to be encoded; and if it is determined that the length of the sequence to be encoded is greater than or greater than/equal to the preset first length threshold, determining not to segment the sequence to be encoded.

Further, the preset first code rate threshold is 0.4.

Further, before judging whether the length of the sequence to be encoded is greater than or greater than/equal to a preset first length threshold, the method further includes:

determining the first length threshold according to the transmission code rate and a preset first function.

Further, the preset first function is Kth1=int (c*R+b) or Kth1=c*R+b, wherein kth1 is the first length threshold, int is the rounding function, c is a preset first parameter, b is a preset second parameter, and R is the transmission code rate.

Further, c is not greater than 1200 and not less than 800, and b is not greater than 161 and not less than 119.

Further, c is 1000 and b is 140.

Further, the determining a segmentation strategy corresponding to a sequence to be encoded according to a length of the sequence to be encoded and a transmission code rate, includes:

if the transmission code rate is less than or less than/equal to a preset second code rate threshold, judging whether the length of the sequence to be encoded is greater than or greater than/equal to a preset second length threshold;

if it is determined that the length of the sequence to be encoded is greater than or greater than/equal to the preset second length threshold, determining to segment the sequence to be encoded; and if it is determined that the length of the sequence to be encoded is not greater than or greater than/equal to a preset second length threshold, determining not to segment the sequence to be encoded.

Further, the preset second length threshold is not less than 290 and not greater than 390.

Further, the preset second length threshold is 340.

Further, the preset second code rate threshold is 0.2.

Further, the determining a segmentation strategy corresponding to a sequence to be encoded according to a length of the sequence to be encoded and a transmission code rate, includes:

if the transmission code rate is less than or less than/equal to a preset third code rate threshold, judging whether the length of the sequence to be encoded is greater than or greater than/equal to a preset third length threshold;

if it is determined that the length of the sequence to be encoded is greater than or greater than/equal to the preset third length threshold, determining to segment the sequence to be encoded; and if it is determined that the length of the sequence to be encoded is not greater than or greater than/equal to the preset third length threshold, determining not to segment the sequence to be encoded.

Further, the third code rate threshold is 6/25.

Further, the preset third length threshold is not less than 348 and not greater than 472.

Further, the preset third length threshold is 410.

Further, the determining a segmentation strategy corresponding to a sequence to be encoded according to a length of the sequence to be encoded and a transmission code rate, includes:

if the transmission code rate is not less than or greater than a preset third code rate threshold and not greater than or less than a preset fourth code rate threshold, judging whether the length of the sequence to be encoded is greater than or greater than/equal to a preset fourth length threshold, wherein the fourth code rate threshold is greater than the third code rate threshold;

if it is determined that the length of the sequence to be encoded is greater than or greater than/equal to the preset fourth length threshold, determining to segment the sequence to be encoded; and if it is determined that the length of the sequence to be encoded is not greater than or greater than/equal to the preset fourth length threshold, determining not to segment the sequence to be encoded.

Further, before judging whether the length of the sequence to be encoded is greater than or greater than/equal to a preset fourth length threshold, the method further includes:

determining the fourth length threshold according to the transmission code rate and a preset second function.

Further, the preset second function is Kth2=int(a*R+e) or Kth2=a*R+e, wherein kth2 is the fourth length threshold, int is the rounding function, a is a preset third parameter, e is a preset fourth parameter, and R is the transmission code rate.

Further, a is not greater than 1200 and not less than 800, and e is not greater than 196 and not less than 144.

Further, a is 1000 and e is 170.

Further, the determining a segmentation strategy corresponding to a sequence to be encoded according to a length of the sequence to be encoded and a transmission code rate, includes:

judging whether the length of the sequence to be encoded is greater than or greater than/equal to a preset fifth length threshold;

if it is determined that the length of the sequence to be encoded is greater than or greater than/equal to the preset fifth length threshold, determining to segment the sequence to be encoded.

Further, before determining to segment the sequence to be encoded, the method further includes:

judging whether the transmission code rate is less than or less than/equal to a preset fifth code rate threshold;

if it is determined that the transmission code rate is less than or less than/equal to the preset fifth code rate threshold, proceeding to the next step.

Further, the preset fifth code rate threshold is not less than 0.2 and not greater than 0.9.

Further, the preset fifth code rate threshold is 0.75, or 2/3, or 1/2, or 2/5, or 0.38, or 0.36, or 1/3, or 0.3, or 0.28, or 0.26, or 0.24, or 1/4, or 1/5.

Further, the preset fifth length threshold is not less than 300 and not greater than 450.

Further, the preset fifth length threshold is 340, or 350, or 360, or 370, or 380, or 390, or 400, or 410, or 420, or 430, or 440, or 450.

Further, the determining a segmentation strategy corresponding to a sequence to be encoded according to a length of the sequence to be encoded and a transmission code rate, includes:

judging whether the transmission code rate is greater than a preset sixth code rate threshold;

if it is determined that the transmission code rate is greater than the preset sixth code rate threshold, determining to segment the sequence to be encoded according to a preset linear function K_th1=f*R+g or K_th1=int (f*R+g), wherein K_th1 is a first length value, f is a preset fifth parameter value, g is a preset sixth parameter value, R is the transmission code rate, and int is the rounding function.

Further, f is a numerical value in the range of 500-1200 and g is a numerical value in the range of 60-300.

Further, f is 832 and g is 200.

Further, the determining to segment the sequence to be encoded according to a preset linear function K_th1=f*R+g or K_th1=int (f*R+g), includes:

determining to determine a target code rate interval corresponding to the transmission code rate according to at least two preset code rate intervals and a preset linear function K_th1=fn*R+gn or K_th1=int (fn*R+gn) corresponding to each code rate interval, and segment the sequence to be encoded according to a target linear function corresponding to the target code rate interval, wherein the minimum code rate value in the code rate interval is not less than the preset sixth code rate threshold.

Further, the preset sixth code rate threshold is 0.2.

Further, the determining a segmentation strategy corresponding to a sequence to be encoded according to a length of the sequence to be encoded and a transmission code rate, includes:

determining to segment the sequence to be encoded according to a preset linear function K_th2=h*R+i or K_th2=int (h*R+i), wherein K_th2 is a second length value, h is a preset seventh parameter value, i is a preset eighth parameter value, R is the transmission code rate, and int is the rounding function.

Further, h is a numerical value in the range of 500-1200 and i is a numerical value in the range of 60-300.

Further, before determining to segment the sequence to be encoded, the method further includes:

judging whether the length of the sequence to be encoded is less than or equal to a preset fifth length threshold;

if it is determined that the length of the sequence to be encoded is less than or equal to a preset fifth length threshold, proceeding to the next step.

Further, the fifth code rate threshold is between x times the maximum bit length to be encoded and N times the maximum bit length to be encoded, wherein x is a numerical value greater than 0 and less than N.

Further, x is a numerical value greater than or equal to 0.3 and less than 2, and N is 2.

Further, when the segmentation strategy is to segment the sequence to be encoded, the processing the sequence to be encoded according to the segmentation strategy includes:

segmenting an information sequence in the sequence to be encoded; or segmenting the sequence to be encoded containing an information sequence and a CRC sequence.

An embodiment of the invention discloses a polar coding apparatus, which includes:

a determining module configured to determine a segmentation strategy corresponding to a sequence to be encoded according to a length of the sequence to be encoded and a transmission code rate;

an encoding module configured to process the sequence to be encoded according to the segmentation strategy, and perform polar coding on the processed sequence to be encoded.

An embodiment of the invention discloses an electronic device including: a memory and a processor;

the processor is configured to read programs in the memory and perform the process of: determining a segmentation strategy corresponding to a sequence to be encoded according to a length of the sequence to be encoded and a transmission code rate; and processing the sequence to be encoded according to the segmentation strategy, and performing polar coding on the processed sequence to be encoded.

Further, the processor is specifically configured to: judge whether the transmission code rate is greater than or greater than/equal to a preset first code rate threshold; if it is determined that the transmission code rate is greater than or greater than/equal to the preset first code rate threshold, determine not to segment the sequence to be encoded.

Further, the processor is specifically configured to: if the transmission code rate is not greater than or less than a preset first code rate threshold and not less than or greater than a preset second code rate threshold, judge whether the length of the sequence to be encoded is greater than or greater than/equal to a preset first length threshold, wherein the first code rate threshold is greater than the second code rate threshold; if it is determined that the length of the sequence to be encoded is greater than or greater than/equal to a preset first length threshold, determine to segment the sequence to be encoded; and if it is determined that the length of the sequence to be encoded is not greater than or greater than/equal to a preset first length threshold, determine not to segment the sequence to be encoded.

Further, the preset first code rate threshold is 0.4.

Further, the processor is further configured to: determine the first length threshold according to the transmission code rate and a preset first function.

Further, the preset first function is Kth1=int (c*R+b) or Kth1=c*R+b, wherein kth1 is the first length threshold, int is the rounding function, c is a preset first parameter, b is a preset second parameter, and R is the transmission code rate.

Further, c is not greater than 1200 and not less than 800, and b is not greater than 161 and not less than 119.

Further, c is 1000 and b is 140.

Further, the processor is specifically configured to: if the transmission code rate is less than or less than/equal to a preset second code rate threshold, judge whether the length of the sequence to be encoded is greater than or greater than/equal to a preset second length threshold; if it is determined that the length of the sequence to be encoded is greater than or greater than/equal to the preset second length threshold, determine to segment the sequence to be encoded; if it is determined that the length of the sequence to be encoded is not greater than or greater than/equal to the preset second length threshold, determine not to segment the sequence to be encoded.

Further, the preset second length threshold is not less than 290 and not greater than 390.

Further, the preset second length threshold is 340.

Further, the preset second code rate threshold is 0.2.

Further, the processor is specifically configured to: if the transmission code rate is less than or less than/equal to a preset third code rate threshold, judge whether the length of the sequence to be encoded is greater than or greater than/equal to a preset third length threshold; if it is determined that the length of the sequence to be encoded is greater than or greater than/equal to the preset third length threshold, determine to segment the sequence to be encoded; and if it is determined that the length of the sequence to be encoded is not greater than or greater than/equal to the preset third length threshold, determine not to segment the sequence to be encoded.

Further, the third code rate threshold is 6/25.

Further, the preset third length threshold is not less than 348 and not greater than 472.

Further, the preset third length threshold is 410.

Further, the processor is specifically configured to: if the transmission code rate is not less than or greater than a preset third code rate threshold and not greater than or less than a preset fourth code rate threshold, judge whether the length of the sequence to be encoded is greater than or greater than/equal to a preset fourth length threshold, wherein the fourth code rate threshold is greater than the third code rate threshold; if it is determined that the length of the sequence to be encoded is greater than or greater than/equal to the preset fourth length threshold, determine to segment the sequence to be encoded; and if it is determined that the length of the sequence to be encoded is not greater than or greater than/equal to the preset fourth length threshold, determine not to segment the sequence to be encoded.

Further, the processor is further configured to: determine the fourth length threshold according to the transmission code rate and a preset second function before judging whether the length of the sequence to be encoded is greater than or greater than/equal to a preset fourth length threshold.

Further, the preset second function is Kth2=int(a*R+e) or Kth2=a*R+e, wherein kth2 is the fourth length threshold, int is the rounding function, a is a preset third parameter, e is a preset fourth parameter, and R is the transmission code rate.

Further, a is not greater than 1200 and not less than 800, and e is not greater than 196 and not less than 144.

Further, a is 1000 and e is 170.

Further, the processor is specifically configured to: judge whether the transmission code rate is greater than or greater than/equal to a preset fourth code rate threshold; if it is determined that the transmission code rate is greater than or greater than/equal to a preset fourth code rate threshold, determine not to segment the sequence to be encoded.

Further, the preset fourth code rate threshold is 9/25.

Further, the processor is specifically configured to: judge whether the length of the sequence to be encoded is greater than or greater than/equal to a preset fifth length threshold; if it is determined that the length of the sequence to be encoded is greater than or greater than/equal to a preset fifth length threshold, determine to segment the sequence to be encoded.

Further, the processor is specifically configured to: judge whether the transmission code rate is less than or less than/equal to a preset fifth code rate threshold; if it is determined that the transmission code rate is less than or less than/equal to a preset fifth code rate threshold, determine to segment the sequence to be encoded.

Further, the preset fifth code rate threshold is not less than 0.2 and not greater than 0.9.

Further, the preset fifth code rate threshold is 0.75, or 2/3, or 1/2, or 2/5, or 0.38, or 0.36, or 1/3, or 0.3, or 0.28, or 0.26, or 0.24, or 1/4, or 1/5.

Further, the preset fifth length threshold is not less than 300 and not greater than 450.

Further, the preset fifth length threshold is 340, or 350, or 360, or 370, or 380, or 390, or 400, or 410, or 420, or 430, or 440, or 450.

Further, the processor is specifically configured to: judge whether the transmission code rate is greater than a preset sixth code rate threshold; if it is determined that the transmission code rate is greater than the preset sixth code rate threshold, determine to segment the sequence to be encoded according to a preset linear function $K\_th1=f*R+g$ or $K\_th1=int\ (f*R+g)$, wherein $K\_th1$ is a first length value, f is a preset fifth parameter value, g is a preset sixth parameter value, R is the transmission code rate, and int is the rounding function.

Further, f is a numerical value in the range of 500-1200 and g is a numerical value in the range of 60-300.

Further, f is 832 and g is 200.

Further, the processor is specifically configured to: determine to determine a target code rate interval corresponding to the transmission code rate according to at least two preset code rate intervals and a preset linear function $K\_th1=fn*R+gn$ or $K\_th1=int\ (fn*R+gn)$ corresponding to each code rate interval, and segment the sequence to be encoded according to a target linear function corresponding to the target code rate interval, wherein the minimum code rate value in the code rate interval is not less than the preset sixth code rate threshold.

Further, the preset sixth code rate threshold is 0.2.

Further, the processor is specifically configured to: determine to segment the sequence to be encoded according to a preset linear function $K\_th2=h*R+i$ or $K\_th2=int\ (h*R+i)$, wherein $K\_th2$ is a second length value, h is a preset seventh parameter value, i is a preset eighth parameter value, R is the transmission code rate, and int is the rounding function.

Further, h is a numerical value in the range of 500-1200 and i is a numerical value in the range of 60-300.

Further, the processor is further configured to: judge whether the length of the sequence to be encoded is less than or equal to a preset fifth length threshold; if it is determined that the length of the sequence to be encoded is less than or equal to the preset fifth length threshold, proceed to the step of determining to segment the sequence to be encoded.

Further, the fifth code rate threshold is between x times the maximum bit length to be encoded and N times the maximum bit length to be encoded, wherein x is a numerical value greater than 0 and less than N.

Further, x is a numerical value greater than or equal to 0.3 and less than 2, and N is 2.

Further, the processor is specifically configured to: segment an information sequence in the sequence to be encoded or segment the sequence to be encoded containing an information sequence and a CRC sequence when the segmentation strategy is to segment the sequence to be encoded.

An embodiment of the invention discloses a computer readable storage medium storing computer programs executable by an electronic device, where the programs cause the electronic device to perform steps of any method described above when running on the electronic device.

The embodiments of the invention disclose a polar coding method and apparatus, an electronic device, and a storage medium. The solution includes: determining the segmentation strategy corresponding to the sequence to be encoded according to the length of the sequence to be encoded and the transmission code rate; and processing the sequence to be encoded according to the segmentation strategy, and performing the polar coding on the processed sequence to be encoded. In the embodiments of the invention, the segmentation strategy corresponding to the sequence to be encoded may be determined according to the length of the sequence to be encoded and the transmission code rate, so the corresponding segmentation strategies are determined for the sequences to be encoded of different lengths and different transmission code rates, ensuring the performance of the uplink control channel.

BRIEF DESCRIPTION OF THE DRAWINGS

In order to illustrate the embodiments of the invention or the technical solutions in the prior art more clearly, the accompanying figures which need to be used in describing the embodiments or the prior art will be introduced below briefly. Obviously the accompanying figures described below are merely some embodiments of the invention, and other accompanying figures can also be obtained by those ordinary skilled in the art according to these accompanying figures without creative labor.

DETAILED DESCRIPTION OF THE EMBODIMENTS

In order to make the objects, technical solutions and advantages of the invention clearer, the invention will be further illustrated below in details with reference to the accompanying drawings. Obviously the described embodiments are a part of the embodiments of the invention but not all the embodiments. Based upon the embodiments of the invention, all of other embodiments obtained by those ordinary skilled in the art without creative work pertain to the protection scope of the invention.

In the embodiments of the invention, for ease of reading, the embodiments are numbered, for example, first, second, third, . . . fifteenth embodiments, etc., but this does not mean that all the embodiments are completely independent and cannot be combined. In fact, each numbered embodiment is used to explain how a certain solution is implemented, and various embodiments may be used in combination as needed to obtain the desired effect.

First Embodiment

Figure 1:
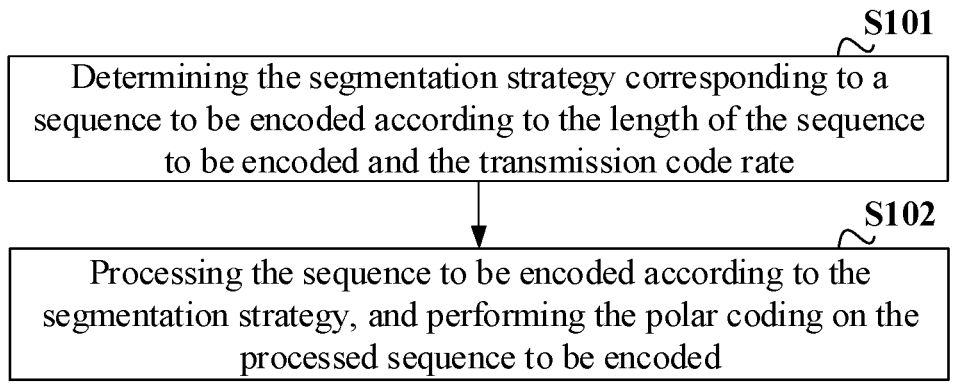
FIG. 1 is a schematic diagram of a polar coding process provided by a first embodiment of the invention.

FIG. 1 is a schematic diagram of a polar coding process provided by the embodiment of the invention. This method includes the following steps.

S101: determining a segmentation strategy corresponding to a sequence to be encoded according to the length of the sequence to be encoded and the transmission code rate.

The polar coding method provided in the embodiment of the invention is applied to a transmitting end, and specifically, the transmitting end may be a base station or a User Equipment (UE).

In a Long Term Evolution (LTE) system, the Physical Uplink Control Channel (PUCCH) is used to transmit the synchronized UCI, and the UCI transmitted on the PUCCH includes the uplink Scheduling Request (SR), the downlink Hybrid Automatic Repeat Request Acknowledgment (HARQ-ACK) information, and the periodic Channel Quality Indicator (CQI) information of the UE. In order to ensure that the receiving end can verify the received UCI accurately, the transmitting end may add a CRC sequence for checking behind the UCI information sequence before encoding the UCI. In an embodiment of the invention, the sequence to be encoded includes the UCI information sequence and the CRC sequence for checking, that is, the sequence to be encoded is the obtained UCI payload. The transmission code rate (R) is the ratio of the length (K) of the sequence to be encoded to the length (M) of the sequence obtained after performing the polar coding and rate matching on the sequence to be encoded, that is, R=K/M.

Furthermore, in an embodiment of the invention, at least one length threshold and/or at least one code rate threshold are set respectively for the length of the sequence to be encoded and the transmission code rate, and the corresponding segmentation strategy is set for the at least one length threshold and/or at least one code rate threshold, where the segmentation strategy is to segment the sequence to be encoded or not to segment the sequence to be encoded. The segmentation strategy corresponding to the sequence to be encoded may be determined according to the length of the sequence to be encoded and transmission code rate as well as at least one length threshold and/or at least one code rate threshold.

S102: processing the sequence to be encoded according to the segmentation strategy, and performing the polar coding on the processed sequence to be encoded.

Specifically, if it is determined that the sequence to be encoded is to be segmented, the segmentation is performed, for example, the sequence to be encoded is divided into two segments, and the polar coding is performed on the sequence to be encoded after the segmentation; if it is determined that the sequence to be encoded is not to be segmented, the polar coding is performed directly on the sequence to be encoded. In an embodiment of the invention, if it is determined that the sequence to be encoded is to be segmented, the information sequence in the sequence to be encoded may be segmented, and each segment of information sequence after the segmentation is added with the CRC, or partial segmented information sequences are added with the CRC.

Figure 2:
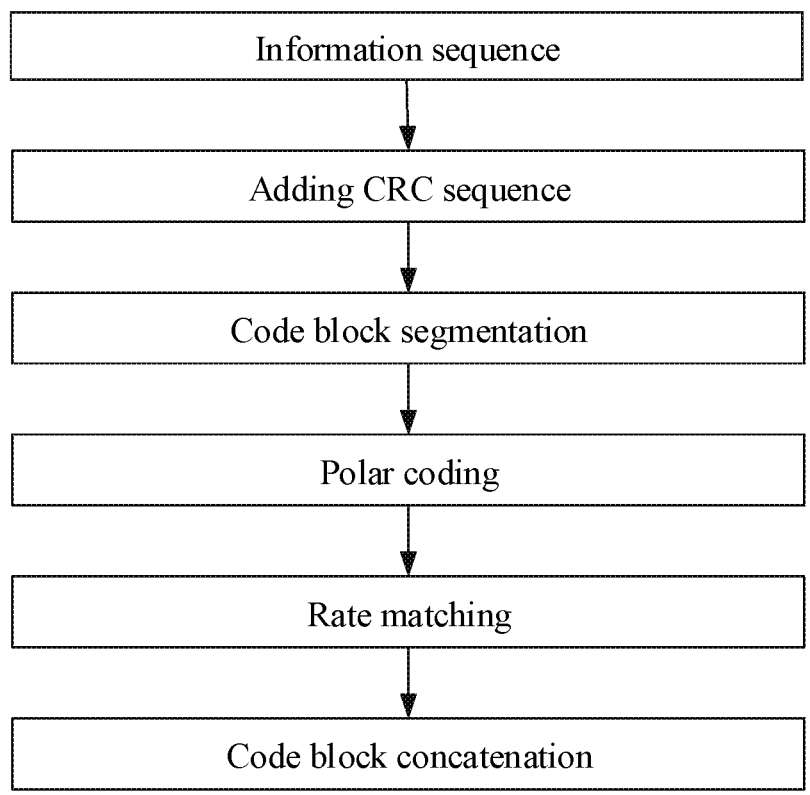
FIG. 2 is a schematic diagram of a polar coding flow provided by the first embodiment of the invention.

FIG. 2 is a schematic diagram of a polar coding process provided by an embodiment of the invention. Specifically, the UCI information sequence (information bits) is firstly subjected to CRC encoding, and a CRC sequence (CRC attachment) is added behind the UCI information sequence to obtain the sequence to be encoded, i.e., UCI payload; the code block segmentation is performed on the sequence to be encoded to segment the sequence to be encoded. In an implementation, the sequence to be encoded is divided into two segments equally, the polar coding is performed respectively on the two segments into which the sequence to be encoded is divided, and the rate matching is performed on two encoded segments of the sequence to be encoded, and finally, after the rate matching is completed, the code block concatenation output is performed on two encoded segments of the sequence to be encoded. Furthermore, in the above-mentioned process of performing the polar coding on the sequence to be encoded, it is also possible to perform the code block segmentation on the UCI information sequence at first, then add a bit sequence of set length to the UCI information sequence after the code block segmentation, and then perform the subsequent polar coding process. Compared with the mode of directly adding the CRC sequence to the UCI information sequence, in this way, the length of the CRC sequence increases, which may obviously reduce the performance of the system, but each segmented UCI information sequence contains the CRC sequence, so it is simpler and easy to operate during the decoding.

In the embodiments of the invention, the segmentation strategy corresponding to the sequence to be encoded may be determined according to the length of the sequence to be encoded and the transmission code rate, so the corresponding segmentation strategies are determined for the sequences to be encoded of different lengths and different transmission code rates, ensuring the performance of the uplink control channel.

Second Embodiment

When the transmission code rate belongs to the high code rate, if the sequence to be encoded is not segmented, the Signal-to-Noise Ratio (SNR) may be affected. In order to ensure the performance of the uplink control channel, based on the above embodiments, in the embodiment of the invention, the determining the segmentation strategy corresponding to a sequence to be encoded according to the length of the sequence to be encoded and the transmission code rate, includes:

judging whether the transmission code rate is greater than or greater than/equal to a preset first code rate threshold; and if it is determined that the transmission code rate is greater than or greater than/equal to a preset first code rate threshold, determining not to segment the sequence to be encoded.

Specifically, the transmitting end may judge whether the transmission code rate is greater than the preset first code rate threshold, and if so, determine not to segment the sequence to be encoded, or judge whether the transmission code rate is greater than/equal to the preset first code rate threshold, and if so, determine not to segment the sequence to be encoded.

In an implementation and in an embodiment of the invention, the preset first code rate threshold is 0.4.

Of course, it is not excluded that a transmission code rate greater than 0.4 is used as the first code rate threshold, and the segmented polar coding is not adopted when transmission code rate is higher than this first code rate threshold.

Alternatively, determining the segmentation strategy corresponding to a sequence to be encoded according to the length of the sequence to be encoded and the transmission code rate, includes:

judging whether the transmission code rate is greater than or greater than/equal to a preset fourth code rate threshold; and if it is determined that the transmission code rate is greater than or greater than/equal to a preset fourth code rate threshold, determining not to segment the sequence to be encoded.

In an implementation and in an embodiment of the invention, the preset fourth code rate threshold is 9/25. Of course, it is not excluded that a transmission code rate greater than 9/25 is used as the fourth code rate threshold, and the segmented polar coding is not adopted when the transmission code rate is higher than this fourth code rate threshold.

Third Embodiment

When the transmission code rate belongs to the medium code rate, the lengths of the sequences to be encoded are different, and whether or not to segment the sequence to be encoded may affect the SNR. In order to ensure the performance of the uplink control channel, based on the above embodiments, in the embodiment of the invention, the determining the segmentation strategy corresponding to a sequence to be encoded according to the length of the sequence to be encoded and the transmission code rate, includes:

if the transmission code rate is not greater than or less than a preset first code rate threshold and not less than or greater than a preset second code rate threshold, judging whether the length of the sequence to be encoded is greater than or greater than/equal to a preset first length threshold, where the first code rate threshold is greater than the second code rate threshold; and if it is determined that the length of the sequence to be encoded is greater than or greater than/equal to a preset first length threshold, determining to segment the sequence to be encoded; if it is determined that the length of the sequence to be encoded is not greater than or greater than/equal to a preset first length threshold, determining not to segment the sequence to be encoded.

Specifically, if the transmission code rate is not greater than or less than a preset first code rate threshold and not less than or greater than a preset second code rate threshold, here the first code rate threshold is greater than the second code rate threshold, the transmitting end judges whether the length of the sequence to be encoded is greater than or greater than/equal to a preset first length threshold, and if so, determines to segment the sequence to be encoded; otherwise, determines not to segment the sequence to be encoded.

In an implementation and in an embodiment of the invention, the preset first code rate threshold is 0.4 and the preset second code rate threshold is 0.2.

Alternatively, in an embodiment of the invention, the determining the segmentation strategy corresponding to a sequence to be encoded according to the length of the sequence to be encoded and the transmission code rate, includes:

if the transmission code rate is not less than or greater than a preset third code rate threshold and not greater than or less than a preset fourth code rate threshold, judging whether the length of the sequence to be encoded is greater than or greater than/equal to a preset fourth length threshold, where the fourth code rate threshold is greater than the third code rate threshold;

if it is determined that the length of the sequence to be encoded is greater than or greater than/equal to a preset fourth length threshold, determining to segment the sequence to be encoded; if it is determined that the length of the sequence to be encoded is not greater than or greater than/equal to a preset fourth length threshold, determining not to segment the sequence to be encoded.

In an implementation and in an embodiment of the invention, the preset third code rate threshold is 6/25 and the preset fourth code rate threshold is 9/25.

Figure 3:
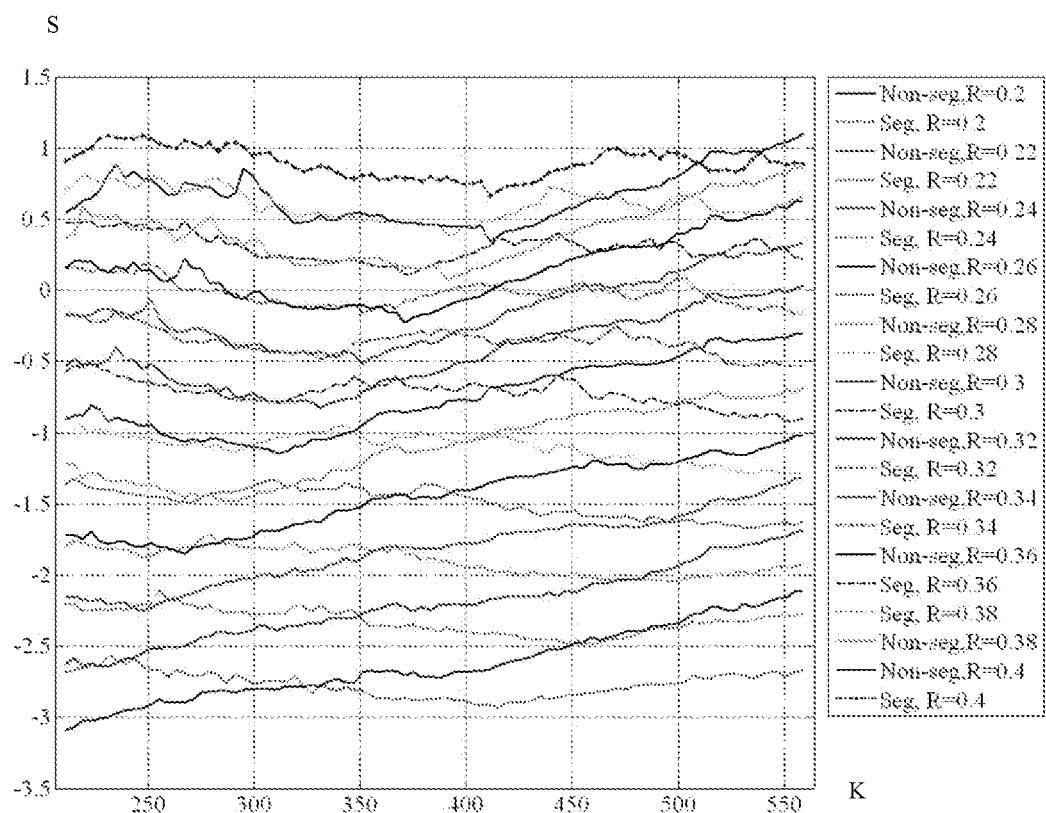
FIG. 3 is a schematic diagram illustrating performance comparison of the uplink control channel provided by a third embodiment of the invention.

The CRC sequence added behind the UCI information sequence is 11 bits, that is, the CRC sequence contained in the sequence to be encoded is 11 bits. When the list size (list size L) used in polar coding is 8, and the corresponding nFAR is 8 in the case of polar decoding (SCL decoding), for different transmission code rates and different lengths of the sequences to be encoded, the polar coding where the sequence to be encoded is segmented or not segmented is adopted, and the corresponding SNR value curve when the BLock Error Rate (BLER) is 0.01 is as shown in FIG. 3. Here, when the 11-bit CRC sequence is used, if the list size L=8 is used for decoding, $nFAR=11-\log_2(8)=8$, and the corresponding False Alarm Probability $(FAR)=1/(2^{nFAR})$; that is, when N-bit CRC sequence is used, if the list size L=t is used for decoding, $nFAR=N-\log_2(t)$, and the corresponding $FAR=1/(2^{nFAR})$.

In FIG. 3, Non-seg represents non-segmentation, seg represents segmentation, R represents the transmission code rate, the horizontal axis of the coordinate system represents the length (K) of the sequence to be encoded, and the vertical axis represents the SNR value (S). When the length of the sequence to be encoded is 550, the curves in the figure from the bottom to the top successively correspond to: Seg, R=0.2; Seg, R=0.22; Non-seg, R=0.2; Seg, R=0.24; R=0.22; Seg, R=0.26; Non-seg, R=0.24; Seg, R=0.28; Non-seg, R=0.26; Seg, R=0.3; Non-seg, R=0.28; 0.32; Non-seg, R=0.3; Seg, R=0.34; Non-seg, R=0.32; Seg, R=0.36; Non-seg, R=0.34; Non-seg, R=0.36; Seg, R=0.38; Non-seg, R=0.38; Seg, R=0.4; Non-seg, R=0.4. Furthermore, in FIG. 3, when the sequence to be encoded is segmented, the information sequence in the sequence to be encoded is segmented, and a segmented information sequence is added with a CRC. As can be seen from FIG. 3, when the transmission code rate is between 0.2 and 0.4, it can be clearly observed that when the transmission code rate is greater than or equal to 0.4, the performance of the polar coding with segmentation is not as good as that of the polar coding without segmentation, so a feasible implementation may be to not use the polar coding with segmentation when the transmission code rate is greater than or equal to 0.4; after the size K of the sequence to be encoded is greater than a certain length threshold, the performance of the polar coding with segmentation will be obviously better than that of the polar coding without segmentation, but the length threshold changes with the transmission code rate. If the appropriate demarcation point cannot be found, the segmented polar coding technology has no practical value in reality.

The above analysis is aimed at the performance comparison between segmentation and non-segmentation when the transmission code rate is between 0.2 and 0.4. When the transmission code rate is between 6/25 and 9/25, when the sequence to be encoded is segmented, and when each segmented information sequence is added with a CRC, the performance comparison between segmentation and non-segmentation is similar to that in FIG. 3 and will not be described here.

In an implementation, it can be observed that as the transmission code rate increases, the length threshold is very close to an oblique line on the plan with K being x axis and SNR being y axis. This inspires the use of linear approximation to estimate this threshold in an implementation. A specific example is as follows: assume that the range of the transmission code rate is [0.2, 0.4], and the linear equation of the threshold in FIG. 3 is y=tx+b, where t and b are constant values. The problem is that the ordinate in FIG. 3 is not the transmission code rate. In order to find the length threshold corresponding to any transmission code rate, the linear interpolation processing is needed. A feasible example may be: when R=[0.2, 0.4], the corresponding K=[350, 550], and since the linear relationship is satisfied, the corresponding ordinate is: [y1=350t+b, y2=550t+b]. Any transmission code rate is R□[0.2, 0.4], and the corresponding ordinate is yR=y1+(y2−y1)*(R−0.2)/(0.4−0.2)=(1000R+150)*t+b, so with the transmission code rate being in the range of [0.2, 0.4], the length threshold satisfies Kth1=int (1000R+150), where R□[0.2, 0.4], and int represents rounding, not excluding a variety of forms such as rounding off, rounding up, rounding down.

Another feasible embodiment is: when R=[0.2, 0.4], the corresponding K=[340, 540], and since the linear relationship is satisfied, the corresponding ordinate is: [y1=340t+b, y2=540t+b]. Any transmission code rate is R□[0.2, 0.4], and the corresponding ordinate is yR=y1+(y2−y1)*(R−0.2)/(0.4−0.2)=(1000R+140)*t+b, so when the code rate is in the range of [0.2, 0.4], the length threshold satisfies Kth1=int (1000R+140), where R□[0.2, 0.4]. The threshold is only related to the transmission code rate, and the relationship with the transmission code rate is linear.

Therefore, in an embodiment of the invention, before judging whether the length of the sequence to be encoded is greater than the preset first length threshold, the method further includes:

determining the first length threshold according to the transmission code rate and a preset first function.

Here, the preset first function is Kth1=int (c*R+b) or Kth1=c*R+b, where kth1 is the first length threshold, int is the rounding function, c is a preset first parameter, b is a preset second parameter, and R is the transmission code rate. Here, the rounding function may be, for example, int function or floor function or the like. The rounding mode of the rounding function int may be set to rounding up, or rounding down, or rounding off, etc.

In the first function described above, c is not greater than 1200 and not less than 800, and b is not greater than 161 and not less than 119. In an implementation, c is 1000 and b is 140.

Alternatively, in an embodiment of the invention, before judging whether the length of the sequence to be encoded is greater than or greater than/equal to the preset fourth length threshold, the method further includes:

determining the fourth length threshold according to the transmission code rate and a preset second function.

Here, the preset second function is Kth2=int(a*R+e) or Kth2=a*R+e, where kth2 is the fourth length threshold, int is the rounding function, a is a preset third parameter, e is a preset fourth parameter, and R is the transmission code rate. In the second function described above, a is not greater than 1200 and not less than 800, and e is not greater than 196 and not less than 144. In an implementation, a is 1000 and e is 170.

Table 1 is an example of the gain values of the uplink control channel corresponding to different transmission code rates (R) when the length of the sequence to be encoded is the first length threshold provided by the embodiment of the invention. Here, the gain value is the difference between the SNR in case of segmentation and the SNR in case of non-segmentation, and the determining function corresponding to the first length threshold is Kth=int (1000*R)+150.

TABLE 1

| R | First length threshold | Gain value |
| --- | --- | --- |
| 0.2 | 350 | 0.128112 |
| 0.22 | 370 | 0.127483 |
| 0.24 | 390 | 0.10674 |
| 0.26 | 410 | 0.149014 |
| 0.28 | 430 | 0.115676 |
| 0.3 | 450 | 0.0837032 |
| 0.32 | 470 | 0.0356907 |
| 0.34 | 490 | 0.08450445 |
| 0.36 | 510 | 0.180271 |
| 0.38 | 530 | 0.2199536 |
| 0.4 | 550 | 0.1574885 |

As shown in Table 1, the first length threshold corresponding to the transmission code rate of 0.2 is 350, and the corresponding gain value is 0.128112; the first length threshold corresponding to the transmission code rate of 0.22 is 370, and the corresponding gain value is 0.127483; the first length threshold corresponding to the transmission code rate of 0.24 is 390, and the corresponding gain value is 0.10674; the first length threshold corresponding to the transmission code rate of 0.26 is 410, and the corresponding gain value is 0.149014; the first length threshold corresponding to the transmission code rate of 0.28 is 430, and the corresponding gain value is 0.115676; the first length threshold corresponding to the transmission code rate of 0.3 is 450, and the corresponding gain value is 0.0837032; the first length threshold corresponding to the transmission code rate of 0.32 is 470, and the corresponding gain value is 0.0356907; the first length threshold corresponding to the transmission code rate of 0.34 is 490, and the corresponding gain value is 0.08450445; the first length threshold corresponding to the transmission code rate of 0.36 is 510, and the corresponding gain value is 0.180271; the first length threshold corresponding to the transmission code rate of 0.38 is 530, and the corresponding gain value is 0.2199536; the first length threshold corresponding to the transmission code rate of 0.4 is 550, and the corresponding gain value is 0.1574885. Therefore, as can be seen, in a case that when the transmission code rate is between 0.2 and 0.4, whether to segment the sequence to be encoded to thereby encode the polar codes is determined according to the first length threshold determined by the first function described above, the gain values are not very large from the above Table 1, so it is very appropriate to use the corresponding first length threshold as the threshold for judgment.

In the embodiment of the invention, the sequence to be encoded includes an information sequence and a CRC sequence, and the corresponding segmentation strategy may be determined according to the length of the sequence to be encoded. Of course, if the corresponding segmentation strategy is determined according to the length of the information sequence, since there is a correspondence between the length of the sequence to be encoded and the length of the information sequence, the corresponding appropriate length threshold may be determined according to the correspondence between the length of the sequence to be encoded and the length of the information sequence when determining the corresponding length threshold if the corresponding segmentation strategy is determined according to the length of the information sequence. The same applies to the following solutions, and the detailed description thereof will be omitted here.

Fourth Embodiment

When the transmission code rate belongs to the low code rate, the lengths of the sequences to be encoded are different, and whether or not to segment the sequence to be encoded may affect the SNR. In order to ensure the performance of the uplink control channel, based on the above embodiments, in the embodiment of the invention, the determining the segmentation strategy corresponding to a sequence to be encoded according to the length of the sequence to be encoded and the transmission code rate, includes:

if the transmission code rate is less than or less than/equal to a preset second code rate threshold, judging whether the length of the sequence to be encoded is greater than or greater than/equal to a preset second length threshold;

if it is determined that the length of the sequence to be encoded is greater than or greater than/equal to a preset second length threshold, determining to segment the sequence to be encoded; if it is determined that the length of the sequence to be encoded is not greater than or greater than/equal to a preset second length threshold, determining not to segment the sequence to be encoded.

Specifically, if the transmission code rate is less than or less than/equal to the preset second code rate threshold, the transmitting end judges whether the length of the sequence to be encoded is greater than or greater than/equal to the preset second length threshold; if so, determines to segment the sequence to be encoded; otherwise, determines not to segment the sequence to be encoded.

In an implementation and in an embodiment of the invention, the preset second code rate threshold is 0.2.

Figure 4:
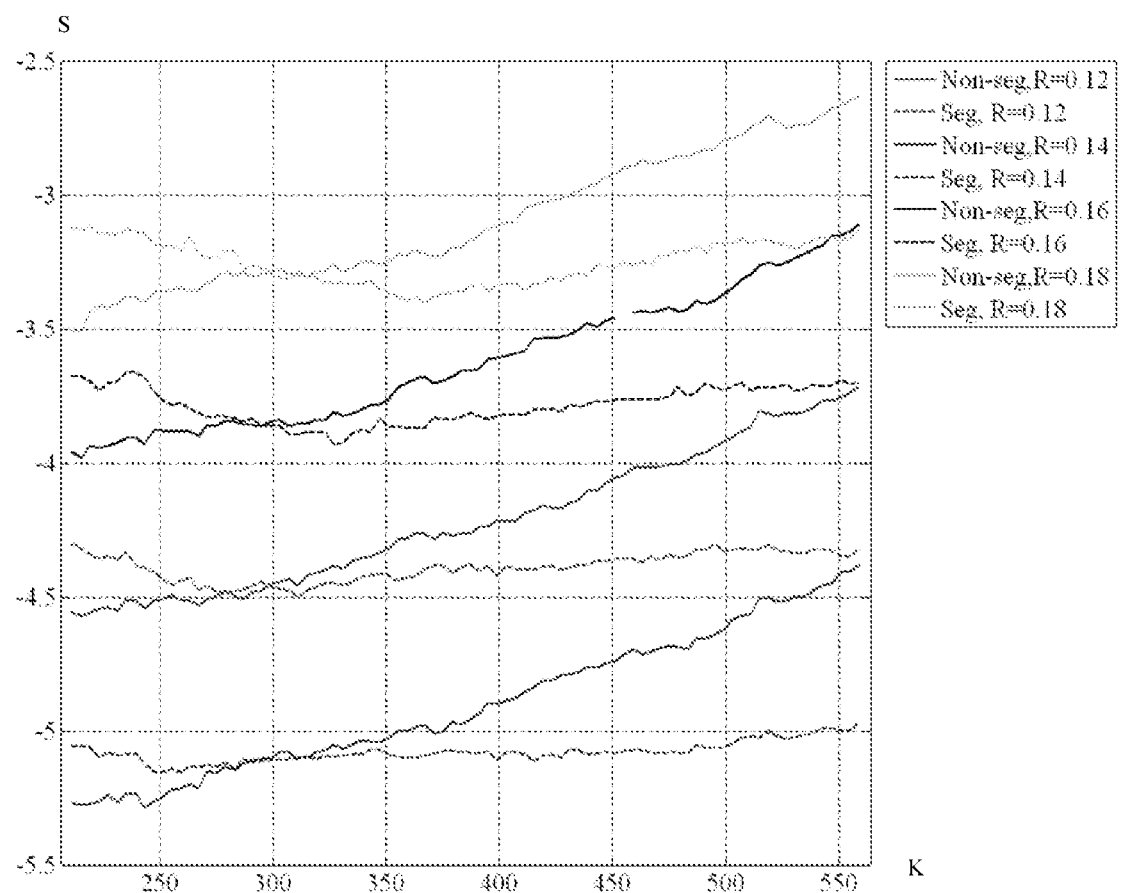
FIG. 4 is a schematic diagram illustrating performance comparison of the uplink control channel provided by a fourth embodiment of the invention.

The CRC sequence added behind the UCI information sequence is 11 bits, that is, the CRC sequence contained in the sequence to be encoded is 11 bits. When the list size L used in polar coding is 8, and the corresponding nFAR is 8 in the case of SCL decoding, for different transmission code rates and different lengths of the sequences to be encoded, the polar coding where the sequence to be encoded is segmented or not segmented is adopted, and the corresponding SNR value curve when the BLER is 0.01 is as shown in FIG. 4. Here, when the 11-bit CRC sequence is used, if the list size L=8 is used for decoding, nFAR=11−log$_2$(8)=8, and at this time, the corresponding FAR=1/(2^nFAR); that is, when N-bit CRC sequence is used, if the list size L=t is used for decoding, nFAR=N-log 2($t$), and the corresponding FAR=1/(2^nFAR).

In FIG. 4, Non-seg represents non-segmentation, seg represents segmentation, R represents the transmission code rate, the horizontal axis of the coordinate system represents the length (K) of the sequence to be encoded, and the vertical axis represents the SNR value (S). When the lengths of the sequences to be encoded are different, the orders of the curves from the bottom to the top in the figure are different, here: when the length of the sequence to be encoded is 400, the curves in the figure from the bottom to the top successively correspond to: Seg, R=0.12; Non-seg, R=0.12; Seg, R=0.14; Non-seg, R=0.14; Seg, R=0.16; Non-seg, R=0.16; Seg, R=0.18; Non-seg, R=0.18. Furthermore, in FIG. 4, when the sequence to be encoded is segmented, the information sequence in the sequence to be encoded is segmented, and a segmented information sequence is added with a CRC. As can be seen from FIG. 4, when the transmission code rate is not greater than 0.2 and the length of the sequence to be encoded is greater than or equal to 290, it can be clearly observed that the polar coding of the segments of sequence to be encoded has the performance gain. In an implementation, a fixed length threshold Kth may be selected when R<0.2, and the segmented polar coding is adopted when K>Kth, where Kth may be selected, such as K=340 or K=310, 320, 330, 350, etc. The fixed length threshold Kth is fixed for each transmission code rate (rate) when R<0.2, and different values between 290 and 390 may also be adopted for each transmission code rate.

Therefore, in an embodiment of the invention, the preset second length threshold is not less than 290 and not greater than 390. Specifically, when the code rate is less than 0.2, the preset second length threshold may be determined in this range. In an implementation, the preset second length threshold is 340, that is, the preset second length threshold is set to 340 during the judgment, and the fixed numerical value is used for the judgment.

The above analysis is aimed at the performance comparison between segmentation and non-segmentation when the transmission code rate is between 0.2 and 0.4. When the transmission code rate is between 6/25 and 9/25, when the sequence to be encoded is segmented, and when each segmented information sequence is added with a CRC, the performance comparison between segmentation and non-segmentation is similar to that in FIG. 4 and will not be described here.

Alternatively, in an embodiment of the invention, the determining the segmentation strategy corresponding to a sequence to be encoded according to the length of the sequence to be encoded and the transmission code rate, includes:

if the transmission code rate is less than or less than/equal to a preset third code rate threshold, judging whether the length of the sequence to be encoded is greater than or greater than/equal to a preset third length threshold;

if it is determined that the length of the sequence to be encoded is greater than or greater than/equal to a preset third length threshold, determining to segment the sequence to be encoded; it is determined that the length of the sequence to be encoded is not greater than or greater than/equal to a preset third length threshold, determining not to segment the sequence to be encoded.

In an embodiment of the invention, the preset third code rate threshold may be 6/25.

The preset third length threshold is not less than 348 and not greater than 472.

The preset third length threshold may be 410.

Table 2 is an example of the gain values of the uplink control channel corresponding to different transmission code rates (R) when the length of the sequence to be encoded is the second length threshold provided by the embodiment of the invention. Here, the gain value is the difference between the SNR in case of segmentation and the SNR in case of non-segmentation.

TABLE 2

| R | Second length threshold | Gain value |
|---|---|---|
| 0.12 | 340 | 0.032309 |
| 0.14 | 340 | 0.069684 |
| 0.16 | 340 | 0.10115 |
| 0.18 | 340 | 0.071813 |

As shown in Table 2, the second length threshold corresponding to the transmission code rate of 0.12 is 340, and the corresponding gain value is 0.032309; the second length threshold corresponding to the transmission code rate of 0.14 is 340, and the corresponding gain value is 0.069684; the second length threshold corresponding to the transmission code rate of 0.16 is 340, and the corresponding gain value is 0.10115; the second length threshold corresponding to the transmission code rate of 0.18 is 340, and the corresponding gain value is 0.071813. Therefore, as can be seen, in a case that when the transmission code rate is not higher than 0.2, whether to segment the sequence to be encoded to thereby encode the polar codes is determined according to the second length threshold described above, the gain values are not very large from the above Table 2, so it is very appropriate to use the corresponding second length threshold as the threshold for judgment.

Fifth Embodiment

The lengths of the sequences to be encoded are different, and whether or not to segment the sequence to be encoded may affect the SNR. In order to ensure the performance of the uplink control channel, based on the above embodiments, in the embodiment of the invention, the determining the segmentation strategy corresponding to a sequence to be encoded according to the length of the sequence to be encoded and the transmission code rate, includes:

judging whether the length of the sequence to be encoded is greater than or greater than/equal to a preset fifth length threshold;

if it is determined that the length of the sequence to be encoded is greater than or greater than/equal to a preset fifth length threshold, determining to segment the sequence to be encoded.

Specifically, the transmitting end may judge whether the length of the sequence to be encoded is greater than or greater than/equal to the preset fifth length threshold, and if so, determine to segment the sequence to be encoded.

Here, the fifth code rate threshold is between x times the maximum bit length to be encoded and N times the maximum bit length to be encoded, where x is a numerical value greater than 0 and less than N, and N is a numerical value greater than 0. In an implementation, x is a numerical value greater than or equal to 0.3 and less than 2, and N is 2.

Figure 5:
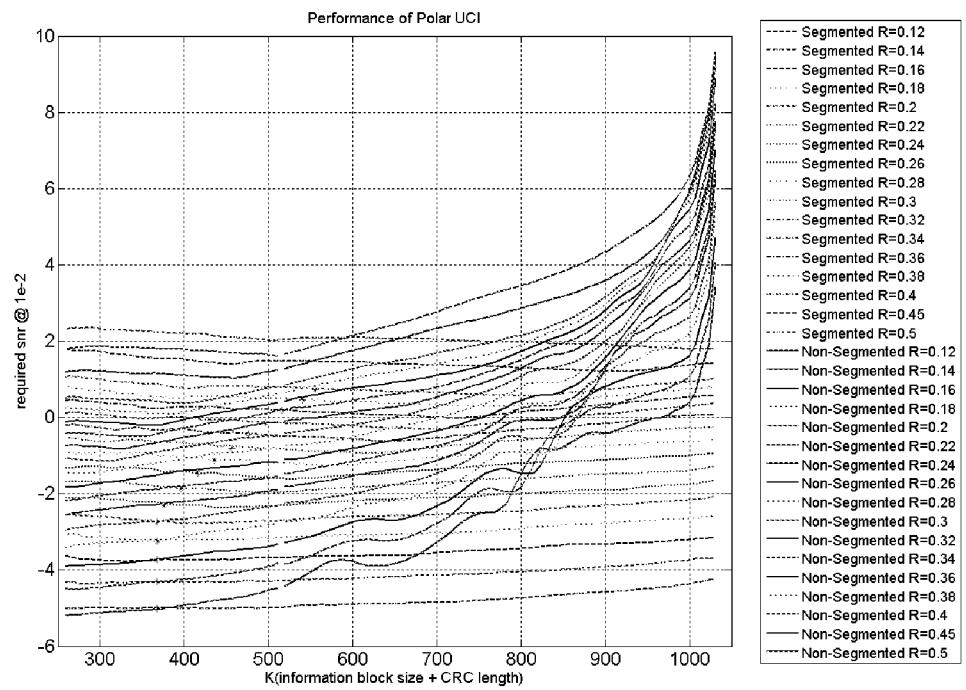
FIG. 5 illustrates a simulation result provided by a fifth embodiment of the invention.

For example, the maximum mother code length of the 5G polar codes is specified as 1024, so the allowed length of the sequence to be encoded must be less than 1024. If the length of the sequence to be encoded is 1060 (greater than or equal to 1024 and less than 2048), the sequence to be encoded is directly segmented for polar coding (for example, divided into two segments for polar coding) regardless of the transmission code rate. The simulation result is as shown in FIG. 5. When the length of the sequence to be encoded is less than the maximum length (1024) of the bits to be encoded and greater than a certain preset value, the direct segmentation may achieve the performance better than that in case of non-segmentation regardless of the transmission code rate, and the processing is simple, where the preset value may be above 500 and under 1200.

Of course, from the implementation perspective, when $x \geq 0.3$, that is, the length of the corresponding sequence to be encoded is greater than or equal to $0.3*1024=307$, the segmentation is performed directly regardless of the transmission code rate. In this way, the performance loss occurs when the length of the sequence to be encoded is shorter, but the segmentation mode is simple and is also feasible.

A feasible scheme of segmenting the sequence to be coded is to adopt the equal division or approximately equal division mode. In an implementation, the sequence to be coded may be divided into only two segments, and then the polar coding is performed on each segment.

Sixth Embodiment

In the fifth embodiment described above, only the length of the sequence to be encoded may be considered, so as to determine whether to perform the segmentation. Furthermore, the difference in the transmission code rates will also affect the performance of the uplink control channel. In order to further ensure the performance of the uplink control channel, based on the fifth embodiment described above, if the length of the sequence to be encoded is greater than or greater than/equal to the preset fifth length threshold, then before determining to segment the sequence to be encoded, the method further includes:

judging whether the transmission code rate is less than or less than/equal to a preset fifth code rate threshold;

if it is determined that the transmission code rate is less than or less than/equal to a preset fifth code rate threshold, proceeding to the next step.

Specifically, if the length of the sequence to be encoded is greater than or greater than/equal to the preset fifth length threshold, the transmitting end judges whether the transmission code rate is less than or less than/equal to the preset fifth code rate threshold, and if so, determines to segment the sequence to be encoded.

In an implementation, the preset fifth code rate threshold is not less than 0.2 and not greater than 0.9. In an implementation, the preset fifth code rate threshold is 0.75, or 2/3, or 1/2, or 2/5, or 0.38, or 0.36, or 1/3, or 0.3, or 0.28, or 0.26, or 0.24, or 1/4, or 1/5.

In an implementation, the preset fifth length threshold is not less than 300 and not greater than 450. In an implementation, the preset fifth length threshold is 340, or 350, or 360, or 370, or 380, or 390, or 400, or 410, or 420, or 430, or 440, or 450.

Here, the feasible value combinations {Rth5, Kth5} of the preset fifth code rate threshold (Rth5) and the preset fifth length threshold (Kth5) in implementations include: {0.4, 350}, {0.4, 370}, {0.4, 380}, {0.4, 390}, {0.4, 400}, {0.4, 410}, {0.4, 420}, {0.28, 370}, {0.28, 380}, {0.28, 390}, {0.28, 400}, {0.28, 410}, {0.28, 420}, {0.26, 370}, {0.26, 380}, {0.26, 390}, {0.26, 400}, {0.26, 410}, and {0.26, 420}.

A feasible implementation mode of segmenting the sequence to be coded is to adopt the equal division or approximately equal division method. In an implementation, the sequence to be coded may be divided into only two segments, and then the polar coding is performed on each segment.

Seventh Embodiment

Due to the massive MIMO and other reasons, the maximum feedback amount of 5G Uplink Control Information (UCI) has greatly increased. In the case of single carrier, the maximum feedback amount of UCI reaches 543 bits without including the 11-bit CRC. The 5G supports each single carrier to feed back the UCI, but also supports multiple carriers to feed back the UCI. Thus, the length of the sequence to be coded will be greater than 543+11=554. As the length of the UCI increases, the segmentation condition will be met at the higher transmission code rate.

In order to ensure the performance of the uplink control channel, based on the above embodiments, in the embodiment of the invention, the determining the segmentation strategy corresponding to a sequence to be encoded according to the length of the sequence to be encoded and the transmission code rate, includes:

judging whether the transmission code rate is greater than a preset sixth code rate threshold;

if it is determined that the transmission code rate is greater than a preset sixth code rate threshold, determining to segment the sequence to be encoded according to a preset linear function K_th1=f*R+g or K_th1=int (f*R+g), where K_th1 is a first length value, f is a preset fifth parameter value, g is a preset sixth parameter value, R is the transmission code rate, and int is the rounding function.

In an implementation, f is a numerical value in the range of 500-1200 and g is a numerical value in the range of 60-300.

In an embodiment of the invention, when the transmission code rate is greater than the preset sixth code rate threshold, the sequence to be coded is segmented directly according to the preset linear function.

In an implementation, the preset sixth code rate threshold is 0.2.

Figure 6:
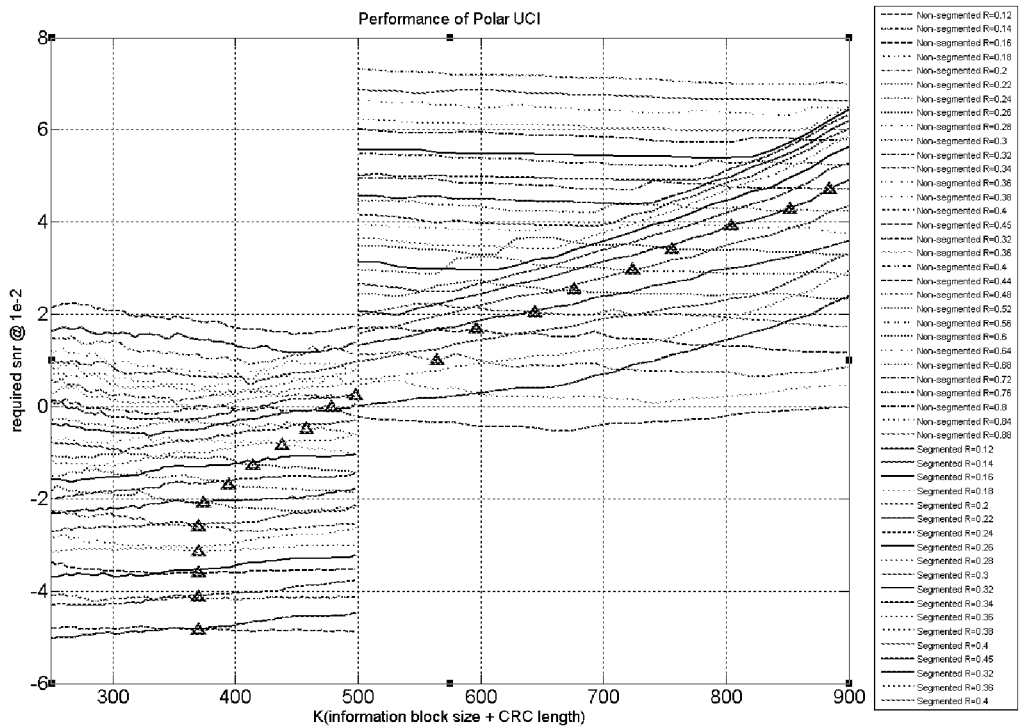
FIG. 6 illustrates a simulation result provided by a seventh embodiment of the invention.

FIG. 6 is a schematic diagram illustrating the corresponding simulation result, and as shown in FIG. 6, the corresponding segmentation method may adopt the following rule:

```
if R<=1/5
K_th = 370;
Else if R>1/5
K_th = 1024*R+150;
End
```

When the code rate is greater than 0.2, the linear function K_th1=1024*R+150 may be used for segmentation.

Figure 7:
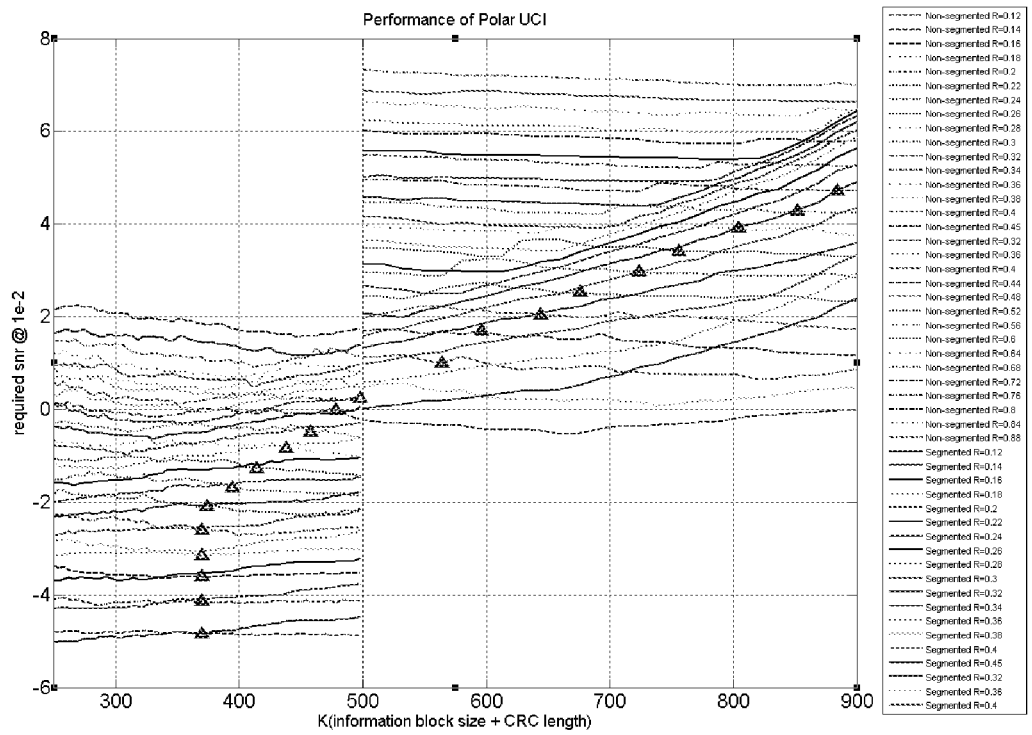
FIG. 7 illustrates a simulation result provided by the seventh embodiment of the invention.

FIG. 7 is a schematic diagram illustrating another simulation result, and as shown in FIG. 7, the corresponding segmentation method may adopt the following rule:

```
if K(i)/M(i) <=1/5
K_th = 350;
elseif K(i)/M(i)>1/5
K_th = 832*R+200;
End
```

When the code rate is greater than 0.2, the linear function K_th1=832*R+200 may also be used for segmentation. The use of this linear function for segmentation may also achieve the better performance.

A feasible implementation mode of segmenting the sequence to be coded is to adopt the equal division or approximately equal division method. In an implementation, the sequence to be coded may be divided into only two segments, and then the polar coding is performed on each segment.

Eighth Embodiment

As shown in FIG. 6 and FIG. 7 described above, in fact, when the number of the bits to be encoded is greater than 600 bits, the demarcation point of the linear function is closer to the crossing point of two performance curves than the previous segmentation mode. In the sense of segmentation, this mode is more accurate. Of course, since the segmentation may increase the complexity of polar decoding, which mode is better and selected needs to make a compromise. Therefore, on the basis of the seventh embodiment, in the embodiment of the invention, other modes may also be considered.

Here, determining to segment the sequence to be encoded according to a preset linear function K_th1=f*R+g or K_th1=int (f*R+g), includes:

determining the target code rate interval corresponding to the transmission code rate according to at least two preset code rate intervals and a preset linear function K_th1=fn*R+gn or K_th1=int (fn*R+gn) corresponding to each code rate interval, and segmenting the sequence to be encoded according to the target linear function corresponding to the target code rate interval, where the minimum code rate value in the code rate interval is not less than the preset sixth code rate threshold.

Specifically, the transmitting end presets at least two code rate intervals and stores the preset linear function K_th1=fn*R+gn or K_th1=int (fn*R+gn) corresponding to each code rate interval, where the minimum code rate value in the code rate interval is not less than the preset sixth code rate threshold. For example, the preset sixth code rate threshold is 0.2, and two preset code rate intervals are greater than 0.2 and less than 0.4, and greater than or equal to 0.4, respectively. When segmenting the sequence to be encoded according to the preset linear function K_th1=f*R+g or K_th1=int (f*R+g), the transmitting end determines the target code rate interval corresponding to the transmission code rate according to the transmission code rate, and segments the sequence to be encoded according to the target linear function corresponding to the target code rate interval.

For example, the linear function corresponding to the code rate interval greater than 0.2 and less than 0.4 is K_th1=1024*R+140, and the linear function corresponding to the code rate interval greater than or equal to 0.4 is K_th1=832*R+200.

Of course, it is also possible to have three or more code rate intervals divided in advance, where each code rate interval corresponds to a different linear function.

In an implementation, the preset sixth code rate threshold is 0.2.

Figure 8:
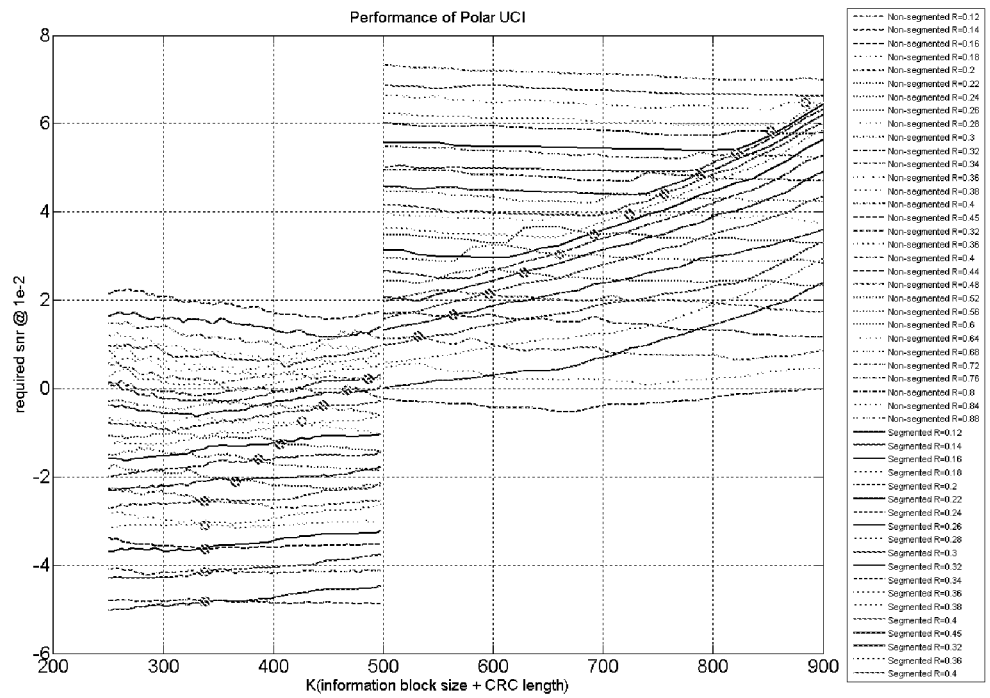
FIG. 8 illustrates a simulation result provided by an eighth embodiment of the invention.

FIG. 8 is a schematic diagram illustrating the simulation result provided by the embodiment of the invention, and as shown in FIG. 8, the corresponding segmentation method adopts the following rule:

```
if R<=1/5
K_th = 340;
elseif R>1/5 && R <2/5
K_th = 1024*R+140;
Elseif R>=2/5
K_th = 832*R+200;
End
```

That is, when the code rate is greater than 0.2 and less than 0.4, the linear function K_th=1024*R+140 may be used for segmentation, and when the code rate is greater than or equal to 0.4, the linear function K_th=832*R+200 is used for segmentation. That is, when R is greater than or equal to 0.4, a linear segmentation function is added on the basis of the original segmentation method, so as to ensure the precision of each interval segmentation.

Ninth Embodiment

In the seventh and eighth embodiments described above, only the transmission code rate may be considered so as to determine whether to segment the sequence to be encoded. Furthermore, the difference in lengths of the sequences to be encoded will also affect the performance of the uplink control channel. In order to further ensure the performance of the uplink control channel, based on the seventh and eighth embodiments described above, before determining to segment the sequence to be encoded, the method further includes:

judging whether the length of the sequence to be encoded is less than or equal to a preset fifth length threshold;

if it is determined that the length of the sequence to be encoded is less than or equal to a preset fifth length threshold, proceeding to the next step.

In an implementation, the fifth code rate threshold is between x times the maximum bit length to be encoded and N times the maximum bit length to be encoded, where x is a numerical value greater than 0 and less than N, and N is a numerical value greater than 0. In an implementation, x is a numerical value greater than or equal to 0.3 and less than 2, and N is 2.

As the code rate increases, when the length of the UCI is greater than the maximum length of the sequence to be encoded, the segmentation may be performed directly regardless of the code rate. The maximum length of the sequence to be encoded is just a specific example, and of course, other lengths are also possible.

Tenth Embodiment

In an implementation, in order to simplify the process, the linear function may be used for segmentation regardless of the transmission code rate, and the determining the segmentation strategy corresponding to a sequence to be encoded according to the length of the sequence to be encoded and the transmission code rate, includes:

segmenting the sequence to be encoded according to a preset linear function K_th2=h*R+i or K_th2=int (h*R+i), where K_th2 is a second length value, h is a preset seventh parameter value, i is a preset eighth parameter value, R is the transmission code rate, and int is the rounding function.

Specifically, in this embodiment, the transmitting end segments the sequence to be encoded according to the preset linear function K_th2=h*R+i or K_th2=int (h*R+i) regardless of the transmission code rate, where there may be one preset linear function or more than two preset linear functions. If more than two linear functions are included, the flexible selection may be made according to the actual situation when performing the segmentation.

In an implementation, h is 500-1200 and i is 60-300.

Eleventh Embodiment

In the tenth embodiment described above, the linear function may be used for segmentation regardless of the transmission code rate. Furthermore, the difference in lengths of the sequences to be encoded will also affect the performance of the uplink control channel. In order to further ensure the performance of the uplink control channel, based on the above embodiments, before determining to segment the sequence to be encoded, the method further includes:

judging whether the length of the sequence to be encoded is less than or equal to a preset fifth length threshold;

if it is determined that the length of the sequence to be encoded is less than or equal to a preset fifth length threshold, proceeding to the next step.

In an implementation, the fifth code rate threshold is between x times the maximum bit length to be encoded and N times the maximum bit length to be encoded, where x is a numerical value greater than 0 and less than N, and N is a numerical value greater than 0. In an implementation, x is a numerical value greater than or equal to 0.3 and less than 2, and N is 2.

The above embodiment may also be understood as: when the code rate is lower than a preset value (such as 0.9), the same linear function is used for segmentation, for example, it may be K_th=832*R+200; when the code rate is higher than the preset value of 0.9, another mode (such as direct segmentation mode) is used, because the direct segmentation mode might be simpler than the linear segmentation mode with the performance gain.

In the embodiment of the invention, the segmentation threshold (Kth) is described according to the length of the sequence to be encoded. In fact, the segmentation threshold may also be described in accordance with the length (M) of the encoded data in the case when the code rate is known. The relationship is M=K/R. By taking Kth=aR+b as an example, both sides are divided by R to obtain Mth=a+b/R, where R is the transmission code rate and K is the length of the sequence to be encoded.

In the embodiment of the invention, the segmentation threshold Kth is described according to the length of the information bits to be encoded. In fact, the segmentation threshold may also be described in accordance with the length M of the encoded data in the case when the code rate is known. The relationship is M=K/R. By taking Kth=aR+b as an example, both sides are divided by R to obtain Mth=a+b/R. Therefore, the mode of segmenting according to the length of the encoded data may be derived correspondingly according to the above-mentioned implementation modes disclosed in the embodiments of the invention, and those skilled in the art may make the corresponding variations according to the above description.

Twelfth Embodiment

Furthermore, in the above-mentioned embodiments and in the embodiment of the invention, when the segmentation strategy is to segment the sequence to be encoded, the processing the sequence to be encoded according to the segmentation strategy includes:

segmenting the information sequence in the sequence to be encoded; or segmenting the sequence to be encoded containing an information sequence and a CRC sequence.

In the embodiment of the invention, the sequence to be encoded includes the information sequence and the CRC sequence. When the sequence to be encoded is segmented, only the sequence to be encoded may be segmented. This is because the CRC sequence is added behind the information sequence to obtain the sequence to be encoded when the polar codes are used for encoding, and then the sequence to be encoded is segmented. A feasible implementation may be to divide into two segments equally and encode two segments of sequence to be encoded respectively by using the polar codes, so only one of the sequences to be encoded obtained after the segmentation may have the CRC.

Alternatively, it is also possible to segment the information sequence in the sequence to be encoded. That is, the information sequence is firstly divided into two segments, and the L-bit (e.g., 11-bit) CRC sequence is added to each segment. For example, the lengths of the information sequences are different or nFAR values are different, and the lengths of the added CRC sequences are different, which may specifically set flexibly according to the requirements.

Thirteenth Embodiment

Figure 9:
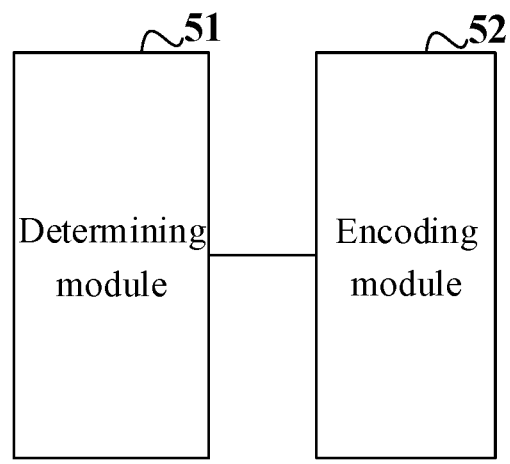
FIG. 9 is a structural schematic diagram of a polar coding apparatus provided by a thirteenth embodiment of the invention.

FIG. 9 is a structural schematic diagram of a polar coding apparatus provided by the embodiment of the invention, where the apparatus includes:

a determining module 51 configured to determine the segmentation strategy corresponding to a sequence to be encoded according to the length of the sequence to be encoded and the transmission code rate;

an encoding module 52 configured to process the sequence to be encoded according to the segmentation strategy, and perform the polar coding on the processed sequence to be encoded.

The determining module 51 is specifically configured to: judge whether the transmission code rate is greater than or greater than/equal to a preset first code rate threshold; if it is determined that the transmission code rate is greater than or greater than/equal to a preset first code rate threshold, determine not to segment the sequence to be encoded.

The determining module 51 is specifically configured to: if the transmission code rate is not greater than or less than a preset first code rate threshold and not less than or greater than a preset second code rate threshold, judge whether the length of the sequence to be encoded is greater than or greater than/equal to a preset first length threshold, wherein the first code rate threshold is greater than the second code rate threshold; if it is determined that the length of the sequence to be encoded is greater than or greater than/equal to a preset first length threshold, determine to segment the sequence to be encoded; otherwise, determine not to segment the sequence to be encoded.

In an implementation, the preset first code rate threshold is 0.4.

The determining module 51 is further configured to: determine the first length threshold according to the transmission code rate and a preset first function.

In an implementation, the preset first function is $Kth1=\text{int}(c*R+b)$ or $Kth1=c*R+b$, where kth1 is the first length threshold, int is the rounding function, c is a preset first parameter, b is a preset second parameter, and R is the transmission code rate.

In an implementation, c is not greater than 1200 and not less than 800, and b is not greater than 161 and not less than 119.

In an implementation, c is 1000 and b is 140.

The determining module 51 is specifically configured to: if the transmission code rate is less than or less than/equal to a preset second code rate threshold, judge whether the length of the sequence to be encoded is greater than or greater than/equal to a preset second length threshold; if it is determined that the length of the sequence to be encoded is greater than or greater than/equal to a preset second length threshold, determine to segment the sequence to be encoded; otherwise, determine not to segment the sequence to be encoded.

In an implementation, the preset second length threshold is not less than 290 and not greater than 390.

In an implementation, the preset second length threshold is 340.

In an implementation, the preset second code rate threshold is 0.2.

In an implementation, the determining module 51 is specifically configured to: if the transmission code rate is less than or less than/equal to a preset third code rate threshold, judge whether the length of the sequence to be encoded is greater than or greater than/equal to a preset third length threshold; if it is determined that the length of the sequence to be encoded is greater than or greater than/equal to a preset third length threshold, determine to segment the sequence to be encoded; otherwise, determine not to segment the sequence to be encoded.

In an implementation, the third code rate threshold is 6/25.

In an implementation, the preset third length threshold is not less than 348 and not greater than 472.

In an implementation, the preset third length threshold is 410.

In an implementation, the determining module 51 is specifically configured to: if the transmission code rate is not less than or greater than a preset third code rate threshold and not greater than or less than a preset fourth code rate threshold, judge whether the length of the sequence to be encoded is greater than or greater than/equal to a preset fourth length threshold, where the fourth code rate threshold is greater than the third code rate threshold; if it is determined that the length of the sequence to be encoded is greater than or greater than/equal to a preset fourth length threshold, determine to segment the sequence to be encoded; otherwise, determine not to segment the sequence to be encoded.

In an implementation, the determining module 51 is further configured to: determine the fourth length threshold according to the transmission code rate and a preset second function before judging whether the length of the sequence to be encoded is greater than or greater than/equal to a preset fourth length threshold.

In an implementation, the preset second function is $Kth2=\text{int}(a*R+e)$ or $Kth2=a*R+e$, where kth2 is the fourth length threshold, int is the rounding function, a is a preset third parameter, e is a preset fourth parameter, and R is the transmission code rate.

In an implementation, a is not greater than 1200 and not less than 800, and e is not greater than 196 and not less than 144.

In an implementation, a is 1000 and e is 170.

In an implementation, the determining module 51 is specifically configured to: judge whether the transmission code rate is greater than or greater than/equal to a preset fourth code rate threshold; if it is determined that the transmission code rate is greater than or greater than/equal to a preset fourth code rate threshold, determine not to segment the sequence to be encoded.

In an implementation, the preset fourth code rate threshold is 9/25.

In an implementation, the determining module 51 is specifically configured to: judge whether the length of the sequence to be encoded is greater than or greater than/equal to a preset fifth length threshold; if it is determined that the length of the sequence to be encoded is greater than or greater than/equal to a preset fifth length threshold, determine to segment the sequence to be encoded.

In an implementation, the determining module 51 is specifically configured to: judge whether the transmission code rate is less than or less than/equal to a preset fifth code rate threshold; if it is determined that the transmission code rate is less than or less than/equal to a preset fifth code rate threshold, determine to segment the sequence to be encoded.

In an implementation, the preset fifth code rate threshold is not less than 0.2 and not greater than 0.9.

In an implementation, the preset fifth code rate threshold is 0.75, or 2/3, or 1/2, or 2/5, or 0.38, or 0.36, or 1/3, or 0.3, or 0.28, or 0.26, or 0.24, or 1/4, or 1/5.

In an implementation, the preset fifth length threshold is not less than 300 and not greater than 450.

In an implementation, the preset fifth length threshold is 340, or 350, or 360, or 370, or 380, or 390, or 400, or 410, or 420, or 430, or 440, or 450.

In an implementation, the determining module 51 is specifically configured to: judge whether the transmission code rate is greater than a preset sixth code rate threshold; if it is determined that the transmission code rate is greater than a preset sixth code rate threshold, determine to segment the sequence to be encoded according to a preset linear function $K\_th1=f*R+g$ or $K\_th1=int\ (f*R+g)$, where $K\_th1$ is a first length value, f is a preset fifth parameter value, g is a preset sixth parameter value, R is the transmission code rate, and int is the rounding function.

In an implementation, f is a numerical value in the range of 500-1200 and g is a numerical value in the range of 60-300.

In an implementation, f is 832 and g is 200.

In an implementation, the determining module 51 is specifically configured to: determine to determine the target code rate interval corresponding to the transmission code rate according to at least two preset code rate intervals and a preset linear function $K\_th1=fn*R+gn$ or $K\_th1=int\ (fn*R+gn)$ corresponding to each code rate interval, and segment the sequence to be encoded according to the target linear function corresponding to the target code rate interval, where the minimum code rate value in the code rate interval is not less than the preset sixth code rate threshold.

In an implementation, the preset sixth code rate threshold is 0.2.

In an implementation, the determining module 51 is specifically configured to: determine to segment the sequence to be encoded according to a preset linear function $K\_th2=h*R+i$ or $K\_th2=int\ (h*R+i)$, where $K\_th2$ is a second length value, h is a preset seventh parameter value, i is a preset eighth parameter value, R is the transmission code rate, and int is the rounding function.

In an implementation, h is a numerical value in the range of 500-1200 and i is a numerical value in the range of 60-300.

In an implementation, the determining module 51 is further configured to: judge whether the length of the sequence to be encoded is less than or equal to a preset fifth length threshold; if it is determined that the length of the sequence to be encoded is less than or equal to a preset fifth length threshold, proceed to the step of determining to segment the sequence to be encoded.

In an implementation, the fifth code rate threshold is between x times the maximum bit length to be encoded and N times the maximum bit length to be encoded, where x is a numerical value greater than 0 and less than N.

In an implementation, x is a numerical value greater than or equal to 0.3 and less than 2, and N is 2.

In an implementation, the encoding module 52 is specifically configured to: segment the information sequence in the sequence to be encoded or segment the sequence to be encoded containing an information sequence and a CRC sequence when the segmentation strategy is to segment the sequence to be encoded.

Fourteenth Embodiment

Based on the same inventive concept, the embodiment of the invention further provides an electronic device. Since the principle solving the problem of the above-mentioned electronic device is similar to the polar coding method, the implementations of the above-mentioned electronic device may refer to the implementations of the method, and the repeated description thereof will be omitted here.

Figure 10:
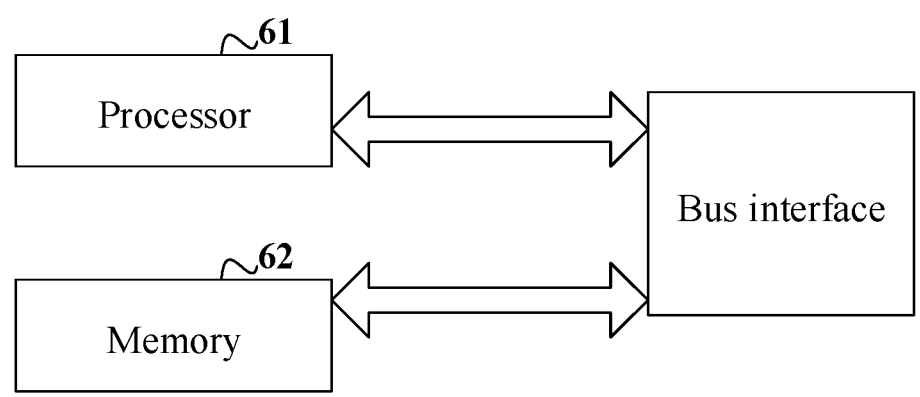
FIG. 10 is a structural schematic diagram of an electronic device provided by a fourteenth embodiment of the invention.

As shown in FIG. 10, it is a structural schematic diagram of the electronic device provided by the embodiment of the invention, where the bus architecture in FIG. 10 may include any numbers of interconnected buses and bridges, and specifically link various circuits of one or more processors represented by the processor 61 and the memory represented by the memory 62. The bus architecture may further link various other circuits such as peripheral device, voltage regulator and power management circuit, which are all well known in the art and thus will not be further described again herein. The bus interface provides an interface. The processor 61 is responsible for managing the bus architecture and general processing, and the memory 62 may store the data used by the processor 61 when performing the operations.

In the electronic device provided by the embodiment of the invention:

the processor 61 is configured to read the programs in the memory 62 and perform the process of: determining the segmentation strategy corresponding to a sequence to be encoded according to the length of the sequence to be encoded and the transmission code rate; and processing the sequence to be encoded according to the segmentation strategy, and performing the polar coding on the processed sequence to be encoded.

In an implementation, the processor 61 is specifically configured to: judge whether the transmission code rate is greater than or greater than/equal to a preset first code rate threshold; if it is determined that the transmission code rate is greater than or greater than/equal to a preset first code rate threshold, determine not to segment the sequence to be encoded.

In an implementation, the processor 61 is specifically configured to: if the transmission code rate is not greater than or less than a preset first code rate threshold and not less than or greater than a preset second code rate threshold, judge whether the length of the sequence to be encoded is greater than or greater than/equal to a preset first length threshold, where the first code rate threshold is greater than the second code rate threshold; if it is determined that the length of the sequence to be encoded is greater than or greater than/equal to a preset first length threshold, determine to segment the sequence to be encoded; otherwise, determine not to segment the sequence to be encoded.

In an implementation, the preset first code rate threshold is 0.4.

In an implementation, the processor 61 is further configured to: determine the first length threshold according to the transmission code rate and a preset function.

In an implementation, the preset function is $Kth=int\ (c*R+b)$ or $Kth=c*R+b$, where kth is the first length threshold, int is the rounding function, c is a preset first parameter, b is a preset second parameter, and R is the transmission code rate.

In an implementation, c is not greater than 1200 and not less than 800, and b is not greater than 161 and not less than 119.

In an implementation, c is 1000 and b is 140.

In an implementation, the processor 61 is specifically configured to: if the transmission code rate is less than or less than/equal to a preset second code rate threshold, judge whether the length of the sequence to be encoded is greater than or greater than/equal to a preset second length threshold; if it is determined that the length of the sequence to be encoded is greater than or greater than/equal to a preset second length threshold, determine to segment the sequence to be encoded; otherwise, determine not to segment the sequence to be encoded.

In an implementation, the preset second length threshold is not less than 290 and not greater than 390.

In an implementation, the preset second length threshold is 340.

In an implementation, the preset second code rate threshold is 0.2.

In an implementation, the processor 61 is specifically configured to: if the transmission code rate is less than or less than/equal to a preset third code rate threshold, judge whether the length of the sequence to be encoded is greater than or greater than/equal to a preset third length threshold; if it is determined that the length of the sequence to be encoded is greater than or greater than/equal to a preset third length threshold, determine to segment the sequence to be encoded; otherwise, determine not to segment the sequence to be encoded.

In an implementation, the third code rate threshold is 6/25.

In an implementation, the preset third length threshold is not less than 348 and not greater than 472.

In an implementation, the preset third length threshold is 410.

In an implementation, the processor 61 is specifically configured to: if the transmission code rate is not less than or greater than a preset third code rate threshold and not greater than or less than a preset fourth code rate threshold, judge whether the length of the sequence to be encoded is greater than or greater than/equal to a preset fourth length threshold, where the fourth code rate threshold is greater than the third code rate threshold; if it is determined that the length of the sequence to be encoded is greater than or greater than/equal to a preset fourth length threshold, determine to segment the sequence to be encoded; otherwise, determine not to segment the sequence to be encoded.

In an implementation, the processor 61 is further configured to: determine the fourth length threshold according to the transmission code rate and a preset second function before judging whether the length of the sequence to be encoded is greater than or greater than/equal to a preset fourth length threshold.

In an implementation, the preset second function is $K_{th2}=int(a*R+e)$ or $K_{th2}=a*R+e$, where kth2 is the fourth length threshold, int is the rounding function, a is a preset third parameter, e is a preset fourth parameter, and R is the transmission code rate.

In an implementation, a is not greater than 1200 and not less than 800, and e is not greater than 196 and not less than 144.

In an implementation, a is 1000 and e is 170.

In an implementation, the processor 61 is specifically configured to: judge whether the transmission code rate is greater than or greater than/equal to a preset fourth code rate threshold; if it is determined that the transmission code rate is greater than or greater than/equal to a preset fourth code rate threshold, determine not to segment the sequence to be encoded.

In an implementation, the preset fourth code rate threshold is 9/25.

In an implementation, the processor 61 is specifically configured to: judge whether the length of the sequence to be encoded is greater than or greater than/equal to a preset fifth length threshold; if it is determined that the length of the sequence to be encoded is greater than or greater than/equal to a preset fifth length threshold, determine to segment the sequence to be encoded.

In an implementation, the processor 61 is specifically configured to: judge whether the transmission code rate is less than or less than/equal to a preset fifth code rate threshold; if it is determined that the transmission code rate is less than or less than/equal to a preset fifth code rate threshold, determine to segment the sequence to be encoded.

In an implementation, the preset fifth code rate threshold is not less than 0.2 and not greater than 0.9.

In an implementation, the preset fifth code rate threshold is 0.75, or 2/3, or 1/2, or 2/5, or 0.38, or 0.36, or 1/3, or 0.3, or 0.28, or 0.26, or 0.24, or 1/4, or 1/5.

In an implementation, the preset fifth length threshold is not less than 300 and not greater than 450.

In an implementation, the preset fifth length threshold is 340, or 350, or 360, or 370, or 380, or 390, or 400, or 410, or 420, or 430, or 440, or 450.

In an implementation, the processor 61 is specifically configured to: judge whether the transmission code rate is greater than a preset sixth code rate threshold; if it is determined that the transmission code rate is greater than a preset sixth code rate threshold, determine to segment the sequence to be encoded according to a preset linear function $K\_th1=f*R+g$ or $K\_th1=int(f*R+g)$, where $K\_th1$ is a first length value, f is a preset fifth parameter value, g is a preset sixth parameter value, R is the transmission code rate, and int is the rounding function.

In an implementation, f is a numerical value in the range of 500-1200 and g is a numerical value in the range of 60-300.

In an implementation, f is 832 and g is 200.

In an implementation, the processor 61 is specifically configured to: determine to determine the target code rate interval corresponding to the transmission code rate according to at least two preset code rate intervals and a preset linear function $K\_th1=fn*R+gn$ or $K\_th1=int(fn*R+gn)$ corresponding to each code rate interval, and segment the sequence to be encoded according to the target linear function corresponding to the target code rate interval, where the minimum code rate value in the code rate interval is not less than the preset sixth code rate threshold.

In an implementation, the preset sixth code rate threshold is 0.2.

In an implementation, the processor 61 is specifically configured to: determine to segment the sequence to be encoded according to a preset linear function $K\_th2=h*R+i$ or $K\_th2=int(h*R+i)$, where $K\_th2$ is a second length value, h is a preset seventh parameter value, i is a preset eighth parameter value, R is the transmission code rate, and int is the rounding function.

In an implementation, h is a numerical value in the range of 500-1200 and i is a numerical value in the range of 60-300.

In an implementation, the processor 61 is further configured to: judge whether the length of the sequence to be encoded is less than or equal to a preset fifth length threshold; if it is determined that the length of the sequence to be encoded is less than or equal to a preset fifth length threshold, proceed to the step of determining to segment the sequence to be encoded.

In an implementation, the fifth code rate threshold is between x times the maximum bit length to be encoded and N times the maximum bit length to be encoded, where x is a numerical value greater than 0 and less than N.

In an implementation, x is a numerical value greater than or equal to 0.3 and less than 2, and N is 2.

In an implementation, the processor 61 is specifically configured to: segment the information sequence in the sequence to be encoded or segment the sequence to be encoded containing an information sequence and a CRC sequence when the segmentation strategy is to segment the sequence to be encoded.

Fifteenth Embodiment

On the basis of the above-mentioned embodiments, the embodiment of the invention further provides a computer readable storage medium storing the computer programs executable by an electronic device, where the programs, when running on the electronic device, cause the electronic device to perform the steps of:

determining the segmentation strategy corresponding to a sequence to be encoded according to the length of the sequence to be encoded and the transmission code rate;

processing the sequence to be encoded according to the segmentation strategy, and performing the polar coding on the processed sequence to be encoded.

In an implementation, the determining the segmentation strategy corresponding to a sequence to be encoded according to the length of the sequence to be encoded and the transmission code rate, includes:

judging whether the transmission code rate is greater than or greater than/equal to a preset first code rate threshold;

if it is determined that the transmission code rate is greater than or greater than/equal to a preset first code rate threshold, determining not to segment the sequence to be encoded.

In an implementation, the determining the segmentation strategy corresponding to a sequence to be encoded according to the length of the sequence to be encoded and the transmission code rate, includes:

if the transmission code rate is not greater than or less than a preset first code rate threshold and not less than or greater than a preset second code rate threshold, judging whether the length of the sequence to be encoded is greater than or greater than/equal to a preset first length threshold, where the first code rate threshold is greater than the second code rate threshold;

if it is determined that the length of the sequence to be encoded is greater than or greater than/equal to a preset first length threshold, determining to segment the sequence to be encoded; otherwise, determining not to segment the sequence to be encoded.

In an implementation, the preset first code rate threshold is 0.4.

In an implementation, before judging whether the length of the sequence to be encoded is greater than the preset first length threshold, the method further includes:

determining the first length threshold according to the transmission code rate and a preset first function.

In an implementation, the preset first function is Kth1=int (c*R+b) or Kth1=c*R+b, where kth1 is the first length threshold, int is the rounding function, c is a preset first parameter, b is a preset second parameter, and R is the transmission code rate.

In an implementation, c is not greater than 1200 and not less than 800, and b is not greater than 161 and not less than 119.

In an implementation, c is 1000 and b is 140.

In an implementation, the determining the segmentation strategy corresponding to a sequence to be encoded according to the length of the sequence to be encoded and the transmission code rate, includes:

if the transmission code rate is less than or less than/equal to a preset second code rate threshold, judging whether the length of the sequence to be encoded is greater than or greater than/equal to a preset second length threshold;

if it is determined that the length of the sequence to be encoded is greater than or greater than/equal to a preset second length threshold, determining to segment the sequence to be encoded; otherwise, determining not to segment the sequence to be encoded.

In an implementation, the preset second length threshold is not less than 290 and not greater than 390.

In an implementation, the preset second length threshold is 340.

In an implementation, the preset second code rate threshold is 0.2.

In an implementation, the determining the segmentation strategy corresponding to a sequence to be encoded according to the length of the sequence to be encoded and the transmission code rate, includes:

if the transmission code rate is less than or less than/equal to a preset third code rate threshold, judging whether the length of the sequence to be encoded is greater than or greater than/equal to a preset third length threshold;

if it is determined that the length of the sequence to be encoded is greater than or greater than/equal to a preset third length threshold, determining to segment the sequence to be encoded; otherwise, determining not to segment the sequence to be encoded.

In an implementation, the third code rate threshold is 6/25.

In an implementation, the preset third length threshold is not less than 348 and not greater than 472.

In an implementation, the preset third length threshold is 410.

In an implementation, the determining the segmentation strategy corresponding to a sequence to be encoded according to the length of the sequence to be encoded and the transmission code rate, includes:

if the transmission code rate is not less than or greater than a preset third code rate threshold and not greater than or less than a preset fourth code rate threshold, judging whether the length of the sequence to be encoded is greater than or greater than/equal to a preset fourth length threshold, where the fourth code rate threshold is greater than the third code rate threshold;

if it is determined that the length of the sequence to be encoded is greater than or greater than/equal to a preset fourth length threshold, determining to segment the sequence to be encoded; otherwise, determining not to segment the sequence to be encoded.

In an implementation, before judging whether the length of the sequence to be encoded is greater than or greater than/equal to the preset fourth length threshold, the method further includes:

determining the fourth length threshold according to the transmission code rate and a preset second function.

In an implementation, the preset second function is $K_{th2}=int(a*R+e)$ or $K_{th2}=a*R+e$, wherein kth2 is the fourth length threshold, int is the rounding function, a is a preset third parameter, e is a preset fourth parameter, and R is the transmission code rate.

In an implementation, a is not greater than 1200 and not less than 800, and e is not greater than 196 and not less than 144.

In an implementation, a is 1000 and e is 170.

In an implementation, the determining the segmentation strategy corresponding to a sequence to be encoded according to the length of the sequence to be encoded and the transmission code rate, includes:

judging whether the transmission code rate is greater than or greater than/equal to a preset fourth code rate threshold;

if it is determined that the transmission code rate is greater than or greater than/equal to a preset fourth code rate threshold, determining not to segment the sequence to be encoded.

In an implementation, the preset fourth code rate threshold is 9/25.

In an implementation, the determining the segmentation strategy corresponding to a sequence to be encoded according to the length of the sequence to be encoded and the transmission code rate, includes:

judging whether the length of the sequence to be encoded is greater than or greater than/equal to a preset fifth length threshold;

if it is determined that the length of the sequence to be encoded is greater than or greater than/equal to a preset fifth length threshold, determining to segment the sequence to be encoded.

In an implementation, before determining to segment the sequence to be encoded, the method further includes:

judging whether the transmission code rate is less than or less than/equal to a preset fifth code rate threshold;

if it is determined that the transmission code rate is less than or less than/equal to a preset fifth code rate threshold, proceeding to the next step.

In an implementation, the preset fifth code rate threshold is not less than 0.2 and not greater than 0.9.

In an implementation, the preset fifth code rate threshold is 0.75, or 2/3, or 1/2, or 2/5, or 0.38, or 0.36, or 1/3, or 0.3, or 0.28, or 0.26, or 0.24, or 1/4, or 1/5.

In an implementation, the preset fifth length threshold is not less than 300 and not greater than 450.

In an implementation, the preset fifth length threshold is 340, or 350, or 360, or 370, or 380, or 390, or 400, or 410, or 420, or 430, or 440, or 450.

In an implementation, the determining the segmentation strategy corresponding to a sequence to be encoded according to the length of the sequence to be encoded and the transmission code rate, includes:

judging whether the transmission code rate is greater than a preset sixth code rate threshold;

if it is determined that the transmission code rate is greater than a preset sixth code rate threshold, determining to segment the sequence to be encoded according to a preset linear function $K\_th1=f*R+g$ or $K\_th1=int(f*R+g)$, where $K\_th1$ is a first length value, f is a preset fifth parameter value, g is a preset sixth parameter value, R is the transmission code rate, and int is the rounding function.

In an implementation, f is a numerical value in the range of 500-1200 and g is a numerical value in the range of 60-300.

In an implementation, f is 832 and g is 200.

In an implementation, the determining to segment the sequence to be encoded according to a preset linear function $K\_th1=f*R+g$ or $K\_th1=int(f*R+g)$, includes:

determining to determine the target code rate interval corresponding to the transmission code rate according to at least two preset code rate intervals and a preset linear function $K\_th1=fn*R+gn$ or $K\_th1=int(fn*R+gn)$ corresponding to each code rate interval, and segment the sequence to be encoded according to the target linear function corresponding to the target code rate interval, where the minimum code rate value in the code rate interval is not less than the preset sixth code rate threshold.

In an implementation, the preset sixth code rate threshold is 0.2.

In an implementation, the determining the segmentation strategy corresponding to a sequence to be encoded according to the length of the sequence to be encoded and the transmission code rate, includes:

determining to segment the sequence to be encoded according to a preset linear function $K\_th2=h*R+i$ or $K\_th2=int(h*R+i)$, where $K\_th2$ is a second length value, h is a preset seventh parameter value, i is a preset eighth parameter value, R is the transmission code rate, and int is the rounding function.

In an implementation, h is a numerical value in the range of 500-1200 and i is a numerical value in the range of 60-300.

In an implementation, before determining to segment the sequence to be encoded, the method further includes:

judging whether the length of the sequence to be encoded is less than or equal to a preset fifth length threshold;

if it is determined that the length of the sequence to be encoded is less than or equal to a preset fifth length threshold, proceeding to the next step.

In an implementation, the fifth code rate threshold is between x times the maximum bit length to be encoded and N times the maximum bit length to be encoded, where x is a numerical value greater than 0 and less than N.

In an implementation, x is a numerical value greater than or equal to 0.3 and less than 2, and N is 2.

In an implementation, when the segmentation strategy is to segment the sequence to be encoded, the processing the sequence to be encoded according to the segmentation strategy includes:

segmenting the information sequence in the sequence to be encoded; or segmenting the sequence to be encoded containing an information sequence and a CRC sequence.

As for the system/device embodiments, they are basically similar to the method embodiments, so the description is relatively simple, and the related parts refer to the description of the parts of the method embodiments.

It should be understood by those skilled in the art that the embodiments of the present application may be provided as methods, systems and computer program products. Thus the present application may take the form of hardware embodiments alone, software embodiments alone, or embodiments combining the software and hardware aspects. Also the present application may take the form of computer program products implemented on one or more computer usable storage mediums (including but not limited to magnetic disk memories, CD-ROMs, optical memories and the like) containing computer usable program codes therein.

The present application is described by reference to the flow charts and/or the block diagrams of the methods, the devices (systems) and the computer program products according to the embodiments of the present application. It should be understood that each process and/or block in the flow charts and/or the block diagrams, and a combination of processes and/or blocks in the flow charts and/or the block diagrams may be implemented by the computer program instructions. These computer program instructions may be provided to a general-purpose computer, a dedicated computer, an embedded processor, or a processor of another programmable data processing device to produce a machine, so that an apparatus for implementing the functions specified in one or more processes of the flow charts and/or one or more blocks of the block diagrams is produced by the instructions executed by the computer or the processor of another programmable data processing device.

These computer program instructions can also be stored in a computer readable memory which is capable of guiding the computer or another programmable data processing device to operate in a particular way, so that the instructions stored in the computer readable memory produce a manufacture including the instruction apparatus which implements the functions specified in one or more processes of the flow charts and/or one or more blocks of the block diagrams.

These computer program instructions may also be loaded onto the computer or another programmable data processing device, so that a series of operation steps are performed on the computer or another programmable device to produce the computer-implemented processing. Thus the instructions executed on the computer or another programmable device provide steps for implementing the functions specified in one or more processes of the flow charts and/or one or more blocks of the block diagrams.

Although the embodiments of the present application have been described, those skilled in the art may make additional alterations and modifications to these embodiments once they learn about the basic creative concepts. Thus the attached claims are intended to be interpreted to include the embodiments as well as all the alterations and modifications falling within the scope of the present application.

Evidently those skilled in the art can make various modifications and variations to the invention without departing from the spirit and scope of the invention. Thus the invention is also intended to encompass these modifications and variations therein as long as these modifications and variations come into the scope of the claims of the invention and their equivalents.

What is claimed is:

1. A polar coding method, comprising:
determining a segmentation strategy corresponding to a sequence to be encoded according to a length of the sequence to be encoded and a transmission code rate;
processing the sequence to be encoded according to the segmentation strategy, and performing polar coding on the processed sequence to be encoded;
wherein determining a segmentation strategy corresponding to a sequence to be encoded according to a length of the sequence to be encoded and a transmission code rate, comprises at least one of following in ways:
a first way:
if the transmission code rate is not greater than or less than a preset first code rate threshold and not less than or greater than a preset second code rate threshold, judging whether the length of the sequence to be encoded is greater than or greater than/equal to a preset first length threshold, wherein the first code rate threshold is greater than the second code rate threshold;
if it is determined that the length of the sequence to be encoded is greater than or greater than/equal to the preset first length threshold, determining to segment the sequence to be encoded; and if it is determined that the length of the sequence to be encoded is not greater than or greater than/equal to the preset first length threshold, determining not to segment the sequence to be encoded;
a second way:
if the transmission code rate is less than or less than/equal to a preset second code rate threshold, judging whether the length of the sequence to be encoded is greater than or greater than/equal to a preset second length threshold;
if it is determined that the length of the sequence to be encoded is greater than or greater than/equal to the preset second length threshold, determining to segment the sequence to be encoded; and if it is determined that the length of the sequence to be encoded is not greater than or greater than/equal to the preset second length threshold, determining not to segment the sequence to be encoded;
a third way:
judging whether the length of the sequence to be encoded is greater than or greater than/equal to a preset fifth length threshold;
if it is determined that the length of the sequence to be encoded is greater than or greater than/equal to the preset fifth length threshold, determining to segment the sequence to be encoded;
a fourth way:
judging whether the transmission code rate is greater than a preset sixth code rate threshold;
if it is determined that the transmission code rate is greater than the preset sixth code rate threshold, determining to segment the sequence to be encoded according to a preset linear function $K\_th1 = f*R + g$ or $K\_th1 = int(f*R + g)$, wherein $K\_th1$ is a first length value, f is a preset fifth parameter value, g is a preset sixth parameter value, R is the transmission code rate, and int is a rounding function;
or
a fifth way:
judging whether the transmission code rate is greater than or greater than/equal to a preset first code rate threshold;
if it is determined that the transmission code rate is greater than or greater than/equal to the preset first code rate threshold, determining not to segment the sequence to be encoded.

2. The method according to claim 1, wherein, when determining a segmentation strategy corresponding to a sequence to be encoded according to a length of the sequence to be encoded and a transmission code rate, comprises: if the transmission code rate is not greater than or less than a preset first code rate threshold and not less than or greater than a preset second code rate threshold, judging whether the length of the sequence to be encoded is greater than or greater than/equal to a preset first length threshold, wherein the first code rate threshold is greater than the second code rate threshold; if it is determined that the length of the sequence to be encoded is greater than or greater than/equal to the preset first length threshold, determining to segment the sequence to be encoded; and if it is determined that the length of the sequence to be encoded is not greater than or greater than/equal to the preset first length threshold, determining not to segment the sequence to be encoded;

before judging whether the length of the sequence to be encoded is greater than or greater than/equal to a preset first length threshold, the method further comprises:
determining the first length threshold according to the transmission code rate and a preset first function.

3. The method according to claim 2, wherein, the preset first function is Kth1=int (c*R+b) or Kth1=c*R+b, wherein kth1 is the first length threshold, int is a rounding function, c is a preset first parameter, b is a preset second parameter, and R is the transmission code rate.

4. The method according to claim 1, wherein, when the determining a segmentation strategy corresponding to a sequence to be encoded according to a length of the sequence to be encoded and a transmission code rate, comprises: judging whether the length of the sequence to be encoded is greater than or greater than/equal to a preset fifth length threshold; if it is determined that the length of the sequence to be encoded is greater than or greater than/equal to the preset fifth length threshold, determining to segment the sequence to be encoded;
before determining to segment the sequence to be encoded, the method further comprises:
judging whether the transmission code rate is less than or less than/equal to a preset fifth code rate threshold;
if it is determined that the transmission code rate is less than or less than/equal to the preset fifth code rate threshold, proceeding to a next step.

5. The method according to claim 1, wherein, when the determining a segmentation strategy corresponding to a sequence to be encoded according to a length of the sequence to be encoded and a transmission code rate, comprises: judging whether the transmission code rate is greater than a preset sixth code rate threshold; if it is determined that the transmission code rate is greater than the preset sixth code rate threshold, determining to segment the sequence to be encoded according to a preset linear function K_th1=f*R+g or K_th1=int (f*R+g), wherein K_th1 is a first length value, f is a preset fifth parameter value, g is a preset sixth parameter value, R is the transmission code rate, and int is a rounding function;
the determining to segment the sequence to be encoded according to a preset linear function K_th1=f*R+g or K_th1=int (f*R+g), comprises:
determining, according to at least two preset code rate intervals and a preset linear function K_th1=fn*R+gn or K_th1=int (fn*R+gn) corresponding to each code rate interval, to determine a target code rate interval corresponding to the transmission code rate, and segment the sequence to be encoded according to a target linear function corresponding to the target code rate interval, wherein a minimum code rate value in the code rate interval is not less than the preset sixth code rate threshold.

6. The method according to claim 1, wherein, when the determining a segmentation strategy corresponding to a sequence to be encoded according to a length of the sequence to be encoded and a transmission code rate, comprises: judging whether the transmission code rate is greater than a preset sixth code rate threshold; if it is determined that the transmission code rate is greater than the preset sixth code rate threshold, determining to segment the sequence to be encoded according to a preset linear function K_th1=f*R+g or K_th1=int (f*R+g), wherein K_th1 is a first length value, f is a preset fifth parameter value, g is a preset sixth parameter value, R is the transmission code rate, and int is a rounding function;
before determining to segment the sequence to be encoded, the method further comprises:
judging whether the length of the sequence to be encoded is less than or equal to a preset fifth length threshold;
if it is determined that the length of the sequence to be encoded is less than or equal to the preset fifth length threshold, proceeding to a next step.

7. The method according to claim 1, wherein, when the determining a segmentation strategy corresponding to a sequence to be encoded according to a length of the sequence to be encoded and a transmission code rate, comprises: judging whether the length of the sequence to be encoded is greater than or greater than/equal to a preset fifth length threshold; if it is determined that the length of the sequence to be encoded is greater than or greater than/equal to the preset fifth length threshold, determining to segment the sequence to be encoded;
the fifth code rate threshold is between x times a maximum bit length to be encoded and N times the maximum bit length to be encoded, wherein x is a numerical value greater than 0 and less than N.

8. The method according to claim 1, wherein, when the segmentation strategy is to segment the sequence to be encoded, the processing the sequence to be encoded according to the segmentation strategy comprises:
segmenting an information sequence in the sequence to be encoded; or
segmenting the sequence to be encoded containing an information sequence and a CRC sequence.

9. An electronic device, comprising a memory and a processor;
wherein the processor is configured to read programs in the memory and perform a process of: determining a segmentation strategy corresponding to a sequence to be encoded according to a length of the sequence to be encoded and a transmission code rate; and processing the sequence to be encoded according to the segmentation strategy, and performing polar coding on the processed sequence to be encoded;
wherein determining a segmentation strategy corresponding to a sequence to be encoded according to a length of the sequence to be encoded and a transmission code rate, comprises at least one of following in ways:
a first way:
if the transmission code rate is not greater than or less than a preset first code rate threshold and not less than or greater than a preset second code rate threshold, judging whether the length of the sequence to be encoded is greater than or greater than/equal to a preset first length threshold, wherein the first code rate threshold is greater than the second code rate threshold;
if it is determined that the length of the sequence to be encoded is greater than or greater than/equal to the preset first length threshold, determining to segment the sequence to be encoded; and if it is determined that the length of the sequence to be encoded is not greater than or greater than/equal to the preset first length threshold, determining not to segment the sequence to be encoded;
a second way:
if the transmission code rate is less than or less than/equal to a preset second code rate threshold, judging whether the length of the sequence to be encoded is greater than or greater than/equal to a preset second length threshold;
if it is determined that the length of the sequence to be encoded is greater than or greater than/equal to the preset second length threshold, determining to segment the sequence to be encoded; and if it is determined that the length of the sequence to be encoded is not greater than or greater than/equal to the preset second length threshold, determining not to segment the sequence to be encoded;

a third way:

judging whether the length of the sequence to be encoded is greater than or greater than/equal to a preset fifth length threshold;

if it is determined that the length of the sequence to be encoded is greater than or greater than/equal to the preset fifth length threshold, determining to segment the sequence to be encoded;

a fourth way:

judging whether the transmission code rate is greater than a preset sixth code rate threshold;

if it is determined that the transmission code rate is greater than the preset sixth code rate threshold, determining to segment the sequence to be encoded according to a preset linear function K_th1=f*R+g or K_th1=int (f*R+g), wherein K_th1 is a first length value, f is a preset fifth parameter value, g is a preset sixth parameter value, R is the transmission code rate, and int is a rounding function;

or a fifth way:

judging whether the transmission code rate is greater than or greater than/equal to a preset first code rate threshold;

if it is determined that the transmission code rate is greater than or greater than/equal to the preset first code rate threshold, determining not to segment the sequence to be encoded.

* * * * *